United States Patent
Ma et al.

(10) Patent No.: US 12,416,856 B2
(45) Date of Patent: Sep. 16, 2025

(54) METHOD OF MANUFACTURING SEMICONDUCTOR DEVICE STRUCTURE

(71) Applicant: NANYA TECHNOLOGY CORPORATION, New Taipei (TW)

(72) Inventors: Shih-Yuan Ma, New Taipei (TW); Yung-Chuan Yeh, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 932 days.

(21) Appl. No.: 17/564,532

(22) Filed: Dec. 29, 2021

(65) Prior Publication Data
US 2023/0205074 A1 Jun. 29, 2023

(51) Int. Cl.
*G03F 1/70* (2012.01)
*H01L 21/027* (2006.01)

(52) U.S. Cl.
CPC ............ *G03F 1/70* (2013.01); *H01L 21/0274* (2013.01)

(58) Field of Classification Search
None
See application file for complete search history.

(56) References Cited

U.S. PATENT DOCUMENTS

| | | | | |
|---|---|---|---|---|
| 6,063,531 | A | * | 5/2000 | Singh .................. G03F 7/70625 356/624 |
| 6,909,930 | B2 | * | 6/2005 | Shishido ........... H01L 21/67276 700/121 |
| 2010/0273107 | A1 | | 10/2010 | Fonseca et al. |
| 2016/0377982 | A1 | * | 12/2016 | deVilliers ............... G03F 7/405 430/325 |
| 2017/0184977 | A1 | * | 6/2017 | Jak ....................... G03F 7/70616 |
| 2017/0213744 | A1 | * | 7/2017 | Park ..................... H01L 21/0332 |
| 2019/0129298 | A1 | * | 5/2019 | Sherwin .............. G03F 7/70625 |

OTHER PUBLICATIONS

Office Action and Search Report mailed on Dec. 19, 2022 related to Taiwanese Application No. 111110898.

\* cited by examiner

*Primary Examiner* — Jonathan Johnson
*Assistant Examiner* — Andrew Preston Traywick
(74) *Attorney, Agent, or Firm* — Xuan Zhang

(57) ABSTRACT

A method of manufacturing a semiconductor device structure is provided. The method includes: providing a substrate; forming a photoresist layer on the substrate; patterning the photoresist layer to form a patterned photoresist layer; forming a pitch adjustment layer on the patterned photoresist layer to define a mask pattern; and determining whether the mask pattern meets a specification of semiconductor fabrication processes; when it is determined that the mask does not meet the specification of semiconductor fabrication processes, performing a rework operation to remove the pitch adjustment layer.

16 Claims, 19 Drawing Sheets

METHOD OF MANUFACTURING SEMICONDUCTOR DEVICE STRUCTURE

TECHNICAL FIELD

The present disclosure relates to a method of manufacturing a semiconductor device, and in particular to a method of forming a pitch adjustment layer to form a mask pattern.

DISCUSSION OF THE BACKGROUND

As semiconductor technology develops, reduction of line width or pitch in photoresist patterns and underlying patterns in lithography operations is becoming much more important. Negative tone development (NTD) or positive tone development (PTD) processes can be utilized to achieve reduced device size. However, NTD and PTD processes may still have drawbacks related to depth of focus (DOF), line width roughness (LWR), or scum. These issues degrade lithography performance and may lead to decreased yield or even device failure. Therefore, while existing NTD and PTD processes have been generally adequate for their intended purposes, they have not been entirely satisfactory in every aspect.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a method of manufacturing a semiconductor device structure. The method includes: providing a substrate; forming a photoresist layer on the substrate; patterning the photoresist layer to form a patterned photoresist layer; forming a pitch adjustment layer on the patterned photoresist layer to define a mask pattern; and determining whether the mask pattern meets a specification of semiconductor fabrication processes; when it is determined that the mask does not meet the specification of semiconductor fabrication processes, performing a rework operation to remove the pitch adjustment layer.

Another aspect of the present disclosure provides another method of manufacturing a semiconductor device structure. The method includes: providing a substrate including a target layer; forming a photoresist layer on the substrate; patterning the photoresist layer to form a patterned photoresist layer with a first pitch; forming a pitch adjustment layer on the patterned photoresist layer to define a mask pattern with a second pitch less than the first pitch; and patterning the target layer by with a pattern by the mask pattern.

Another aspect of the present disclosure provides another method of manufacturing a semiconductor device structure. The method includes: providing a substrate; forming a photoresist layer on the substrate; exposing a first portion of the photoresist layer to radiation while a second portion of the photoresist layer is covered thereby unexposed to the radiation; applying a negative tone developer to the photoresist layer to remove the second portion of the photoresist layer to form the patterned photoresist layer; and forming a pitch adjustment material on the patterned photoresist layer, wherein the pitch adjustment material reacts with the patterned photoresist layer to form a pitch adjustment layer at an interface between the pitch adjustment material and the patterned photoresist layer.

The embodiments of the present disclosure disclose a method of manufacturing a semiconductor device structure. In some embodiments, a pitch adjustment layer is formed on a negative photoresist layer, assisting in defining a mask pattern with a relatively small pitch. Further, if the mask pattern fails to meet the specification of semiconductor manufacturing processes, a rework operation can be performed to remove the pitch adjustment layer and/or the patterned photoresist layer, which can improve yield of the semiconductor device structure.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
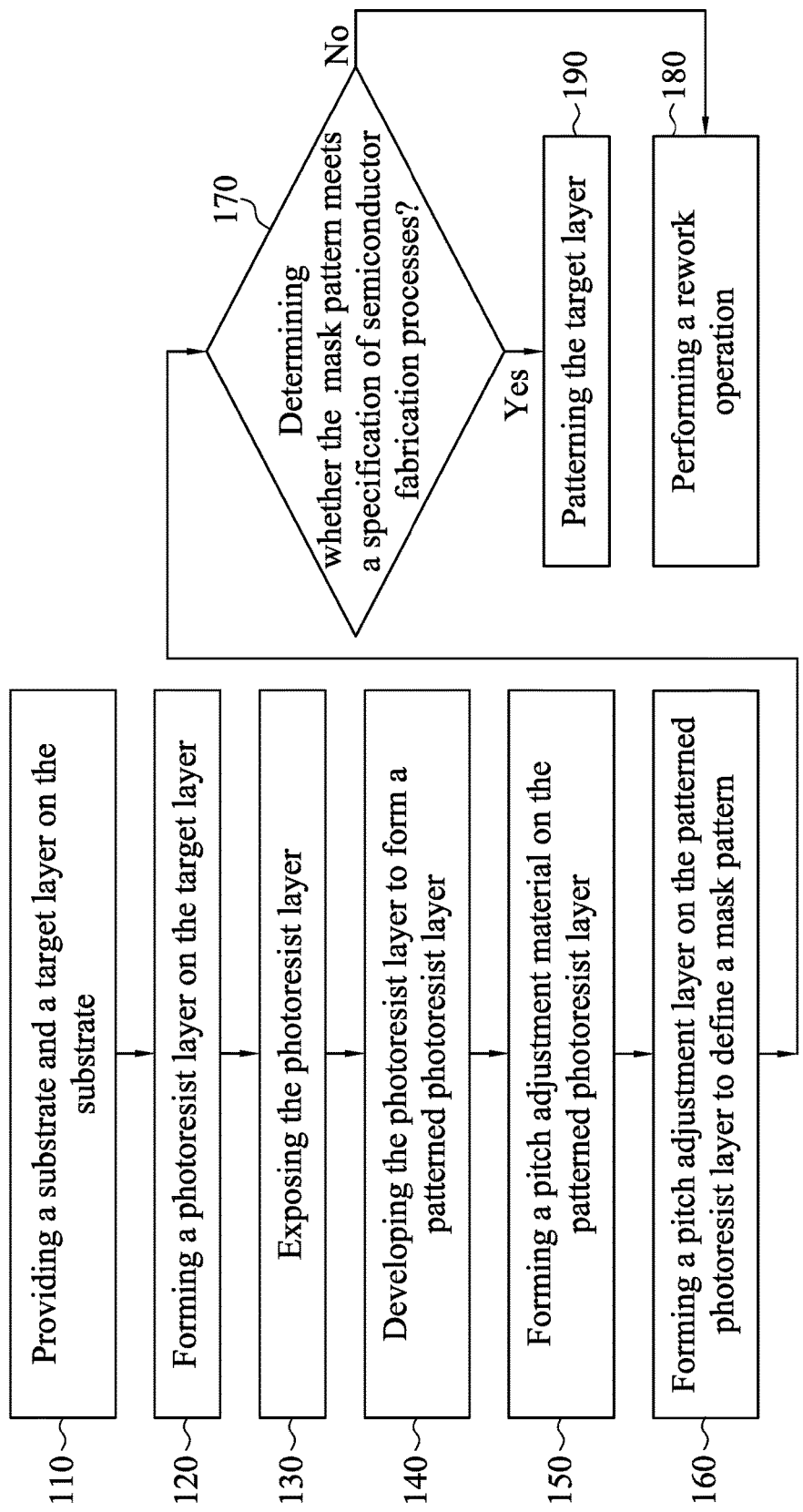
FIG. 1 is a schematic chart illustrating a method of manufacturing a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1, FIG. 1A, FIG. 1B, FIG. 1C, and FIG. 1D are schematic charts illustrating a method 100 of manufacturing a semiconductor device structure, in accordance with some embodiments of the present disclosure.

Referring to FIG. 1, the method 100 begins with operation 110 in which a substrate is provided. A target layer can be formed on or over the substrate. The target layer can be a layer to be patterned. In some embodiments, the target layer can be utilized to form an isolation structure, a gate structure, a source/drain feature, a conductive via, and so on.

The method 100 continues with operation 120 in which a photoresist layer can be formed on the target layer. In some embodiments, the photoresist layer can include a negative-tone photoresist (or a negative photoresist). The portions of the negative-tone photoresist exposed to light become insoluble to a developer solution (e.g., an organic solution), while the portions unexposed to light are soluble thereto.

The method 100 continues with operation 130 in which the photoresist layer can be exposed. In some embodiments, the photoresist layer is exposed to radiation in the form of electromagnetic waves. For example, the electromagnetic wave can include an excimer laser, such as ArF excimer laser with wavelength of 193 nm. In some embodiments, the concentration of the photoacid in the photoresist layer can be enhanced after the photoresist layer is exposed to radiation.

The method 100 continues with operation 140 in which the photoresist layer is developed, thereby forming a patterned photoresist layer. In some embodiments, the photoresist layer can be developed in a developer, such as an organic solvent. The developer can dissolve or otherwise remove unexposed portions of the photoresist layer.

The method 100 continues with operation 150 in which a pitch adjustment material can be formed on the patterned photoresist layer. In some embodiments, the pitch adjustment material can include an acid-reactive material, such as an acid-catalyzed cross-linkable material. The pitch adjustment material can be utilized to react with the photoacid in the patterned photoresist layer.

The method 100 continues with operation 160 in which a pitch adjustment layer can be formed on the patterned photoresist layer to define a mask pattern. The pitch adjustment material can react with the pitch adjustment layer so that the pitch adjustment layer can be formed at an interface between the patterned photoresist layer and the pitch adjustment material. In some embodiments, the mask pattern can include the patterned adjustment layer and the pitch adjustment layer. The mask pattern can be utilized define the pattern of the target layer.

The method 100 continues with operation 170 in which it can be determined whether the mask pattern meets a specification of semiconductor fabrication processes or meets a specific semiconductor fabrication specification. In some embodiments, inspection equipment (or metrology equipment) can be utilized to obtain optical image(s), which can be utilized to calculate or generate inspection data related to overlay (OVL) error, critical dimension (CD), and so on. The inspection equipment can send a signal of inspection data to a controller, which can compare the inspection data and a target inspection data, thereby determining whether the mask pattern meets a specification of semiconductor fabrication processes.

Next, based on the determination of operation 170, operation 180 or operation 190 is performed. In some embodiments, when the mask pattern fails to meet the specification of semiconductor fabrication processes, a rework operation can be performed, as shown in operation 180. In some embodiments, the rework operation can be performed to remove the pitch adjustment layer or remove both the pitch adjustment layer and the patterned photoresist layer.

In some embodiments, when the mask pattern meets the specification of semiconductor fabrication processes, the target layer can be patterned, as shown in operation 190. In some embodiments, the pattern of the target layer can be defined by utilizing the mask pattern. In some embodiments, after the target layer is patterned, the mask pattern can be removed.

Figure 1A:
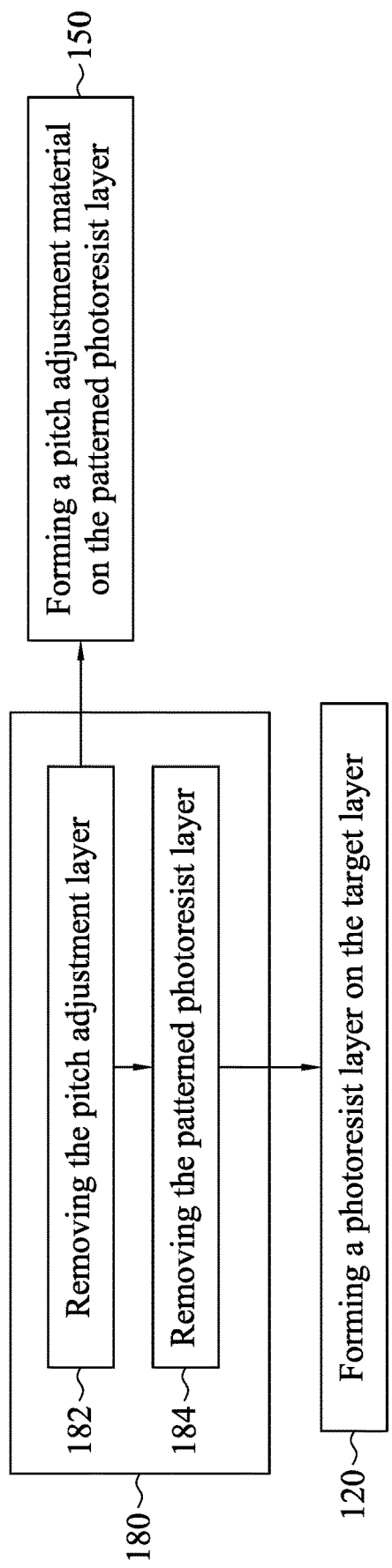
FIG. 1A is a schematic chart illustrating a method of manufacturing a semiconductor device structure, in accordance with some embodiments of the present disclosure.

Referring to FIG. 1A, operation 180 can include operation 182. In some embodiments, operation 182 can include removing the pitch adjustment layer, and the patterned photoresist layer can remain over the target layer. After the operation 182 is performed, the method 100 can continue with operation 150 in which a pitch adjustment material is formed on the patterned photoresist layer.

In some embodiments, operation 180 can further include operation 184. In some embodiments, the patterned photoresist layer can be removed after the pitch adjustment layer is removed. After the operation 184 is performed, the method 100 can continue with operation 120 in which a photoresist layer can be formed on the target layer. In some embodiments, operations 182 and 184 can be performed in the same chamber of equipment or in the same manufacturing location. In some embodiments, the pitch adjustment layer and the patterned photoresist layer can be removed by the same etchant that can remove carbon-containing material, such as polymer or the like.

In some embodiments, the rework operation can be performed until the mask pattern meets the specification of the semiconductor fabrication processes. In a comparative example, a dielectric layer, such as an oxide layer, is conformally formed on the patterned negative photoresist layer to define a mask pattern. If aforesaid mask pattern fails to meet the specification of the semiconductor fabrication processes, it is difficult to remove the dielectric layer without damaging layers (e.g., target layer) beneath the dielectric layer. Further, in a comparative example, an acid-catalyzed cross-linkable material is formed on a positive-tone photoresist to define a mask pattern. Since the positive-tone photoresist generates less photoacid in comparison with the negative-tone photoresist, the pitch of the mask pattern may be larger than that formed by negative-tone photoresist. Moreover, in comparison with the positive-tone photoresist, the acid-reactive material can further react with not only the lateral surface but also the upper surface of the negative-tone photoresist. As a result, etching selectivity can further be improved in subsequent patterning of the target layer.

Figure 1B:
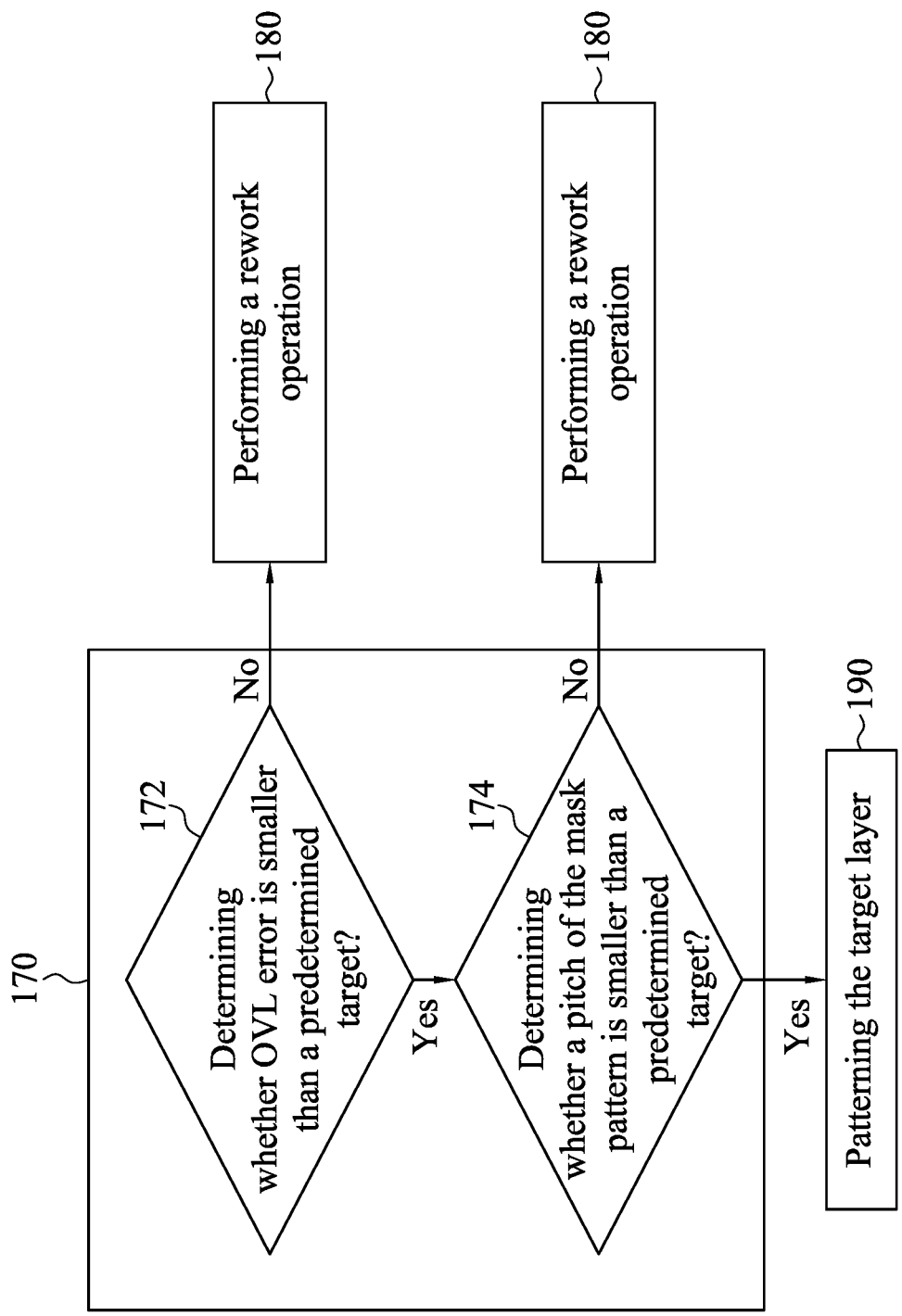
FIG. 1B is a schematic chart illustrating a method of manufacturing a semiconductor device structure, in accordance with some embodiments of the present disclosure.

In some embodiments, operation 170 can include operations 172, 174, or both, as shown in FIG. 1B.

The operation 172 can include determination of whether an overlay error of an overlay mark is smaller than a predetermined target. In some embodiments, the overlay error is an indicative of a degree of misalignment of the overlay mark including a pattern in a pre-layer and a pattern in a current layer. The pre-layer (or a lower-layer) can be located at a horizontal level different from that of the current layer (or an upper-layer). In some embodiments, the pattern of the overlay mark in the current layer can include the photoresist layer and the pitch adjustment layer. In some embodiments, the pattern of the overlay mark in the current layer can be located at a horizontal level the same as that of the mask pattern. The overlay error can include the X-directional deviation (ΔX), the Y-directional deviation (ΔY), or the combination of both.

In some embodiments, overlay measurement equipment can be utilized to measure the overlay error of the overlay mark. The overlay measurement equipment can send a signal of overlay error to the controller, which can compare the overlay error and a target overlay error, thereby determining whether the overlay error of the overlay mark is smaller than a predetermined target.

Next, based on the determination of operation 172, operation 174 or operation 180 is performed. In some embodiments, when the overlay error of the overlay mark is greater than a predetermined target, it can be determined that the position of mask pattern has a relatively great shift and thus the mask pattern fails to meet the specification of the semiconductor fabrication processes. In such a situation, operation 180 can be performed to remove the pitch adjustment layer, the patterned photoresist layer, or both.

In some embodiments, when the overlay error of the overlay mark is smaller than the predetermined target, a determination can be performed to determine whether a pitch of the mask pattern is smaller than a predetermined target, as shown in operation 174. The pitch of the mask pattern can be indicative of the line width of the patterned target layer. The pitch of the mask pattern can be measured by critical dimension metrology equipment, such as a Critical Dimension Scanning Electron Microscope (CD-SEM).

The critical dimension metrology equipment can send a signal of the pitch of the mask pattern to the controller, which can compare the pitch of the mask pattern and a target pitch, thereby determining whether the pitch of the mask pattern is smaller than the predetermined target.

Next, based on the determination of operation 174, operation 180 or operation 190 is performed. In some embodiments, when the pitch of the mask pattern is greater than the predetermined target, it can be determined that the mask pattern fails to meet the specification of the semiconductor fabrication processes. In such a situation, operation 180 can be performed to remove the pitch adjustment layer, the patterned photoresist layer, or both.

In some embodiments, when the overlay error of the overlay mark is smaller than the predetermined target, it can be determined that the mask pattern meets the specification of the semiconductor fabrication processes. In such a situation, operation 190 can be performed to pattern the target layer.

Although FIG. 1B illustrates that operation 170 includes operations 172 and 174, operation 172 or 174 can be omitted based on the requirements of the semiconductor fabrication process. In some embodiments, the order of operations 172 and 174 can be exchanged.

Figure 1C:
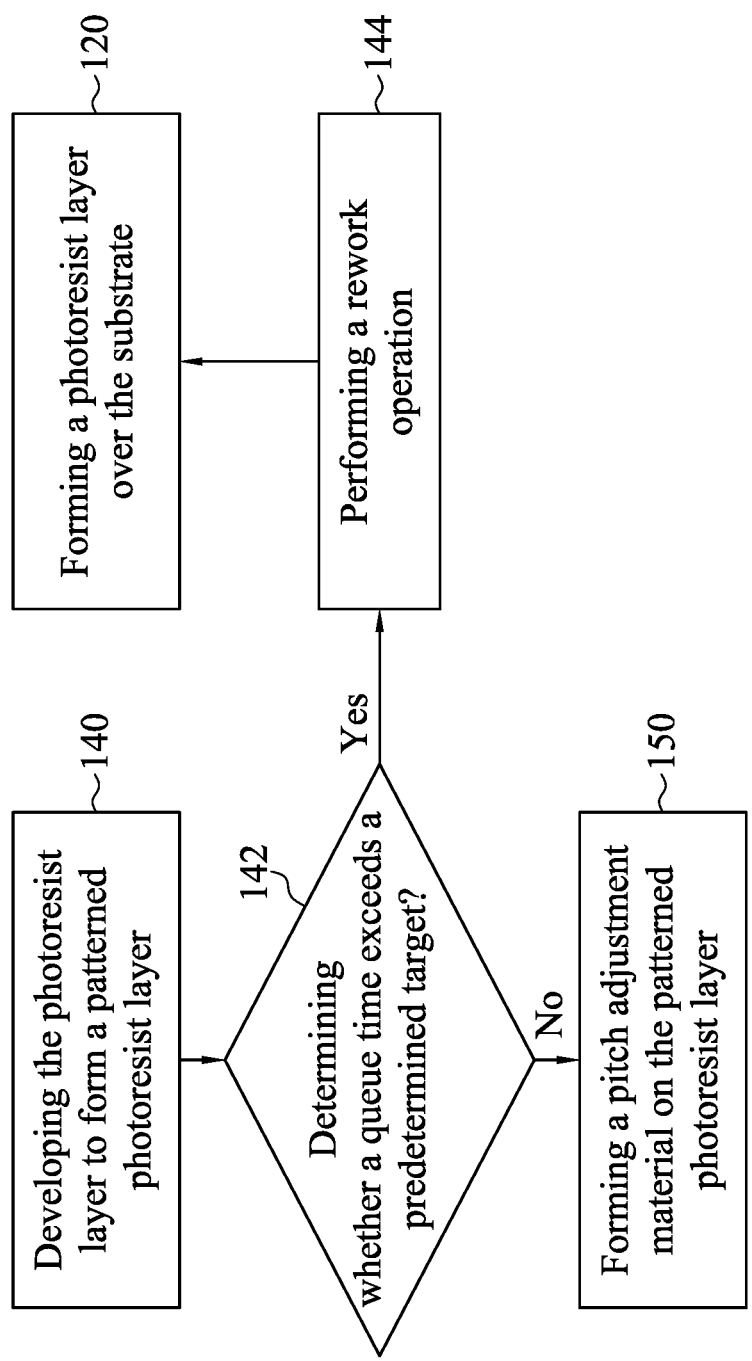
FIG. 1C is a schematic chart illustrating a method of manufacturing a semiconductor device structure, in accordance with some embodiments of the present disclosure.

In some embodiments, the method 100 further include operation 142 between operations 140 and 150, as shown in FIG. 1C. The operation 142 can include determining whether a queue time between operations 140 and 150 exceeds a predetermined target. Next, based on the determination of operation 142, operation 144 or operation 150 is performed. In some embodiments, when the queue time exceeds a predetermined target, a rework operation can be performed, as shown in operation 144. In some embodiments, operation 144 can include removal of the patterned photoresist layer. In some embodiments, the method 100 continues with operation 120 after operation 144 is performed. In some embodiments, a target queue time can be predetermined based on a requirement of the semiconductor fabrication process.

In some embodiments, when the queue time is smaller than a predetermined target, the method 100 continues with operation 150. Since photoacids may decrease as time passes, if the queue time, after the patterned photoresist layer is formed, is too long, the remaining photoacids cannot be utilized to form a pitch adjustment layer of sufficient thickness. As a result, the pitch adjustment layer cannot meet the specification of the semiconductor fabrication processes. Therefore, when the patterned photoresist layer is removed if queue time exceeds the predetermined target, the cost can be improved by omitting subsequent processes.

Figure 1D:
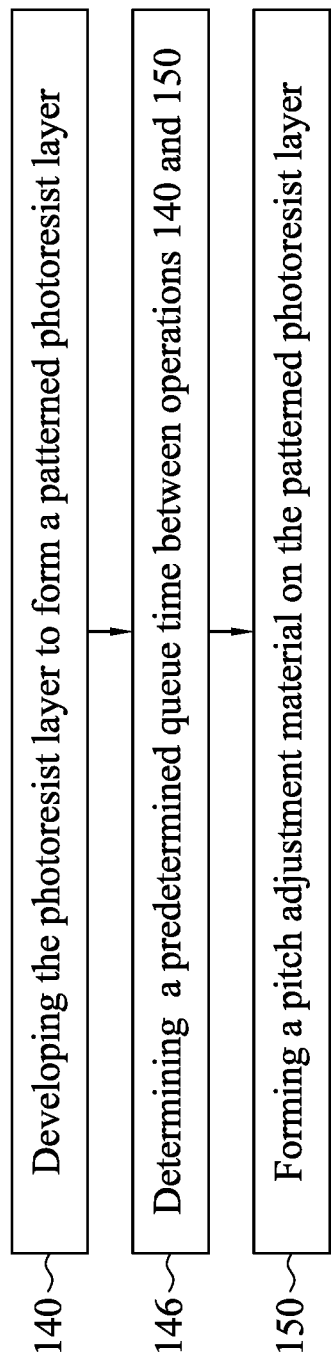
FIG. 1D is a schematic chart illustrating a method of manufacturing a semiconductor device structure, in accordance with some embodiments of the present disclosure.

In some embodiments, the method 100 can further include operation 146 between operations 140 and 150, as shown in FIG. 1D. In some embodiments, operation 146 can include determining a predetermined queue time to control the thickness of the pitch adjustment layer. As described, the amount of photoacids in a patterned photoresist layer decreases as time passes, the thickness of the pitch adjustment layer can be tuned by controlling the queue time between operations 140 and 150. When a predetermined queue time is determined, the thickness of the pitch adjustment layer can be accordingly determined. Thus, the pitch of the mask pattern can tuned. In some embodiments, a controller can be utilized to instruct a wafer or a semiconductor device structure to enter the process equipment at a predetermined time.

The method 100 is merely an example, and is not intended to limit the present disclosure beyond what is explicitly recited in the claims. Additional operations can be provided before, during, or after each operation of the method 100, and some operations described can be replaced, eliminated, or moved around for additional embodiments of the method. In some embodiments, the method 100 can include further operations not depicted in FIG. 1, FIG. 1A, FIG. 1B, FIG. 1C and FIG. 1D. In some embodiments, the method 100 can include one or more operations depicted in FIG. 1, FIG. 1A, FIG. 1B, FIG. 1C and FIG. 1D.

FIG. 2A, FIG. 2B, FIG. 2C, FIG. 2D, FIG. 2E, FIG. 2F, FIG. 2G, FIG. 3, FIG. 4A and FIG. 4B illustrate various stages of manufacturing a semiconductor device, in accordance with some embodiments of the present disclosure.

Figure 2A:
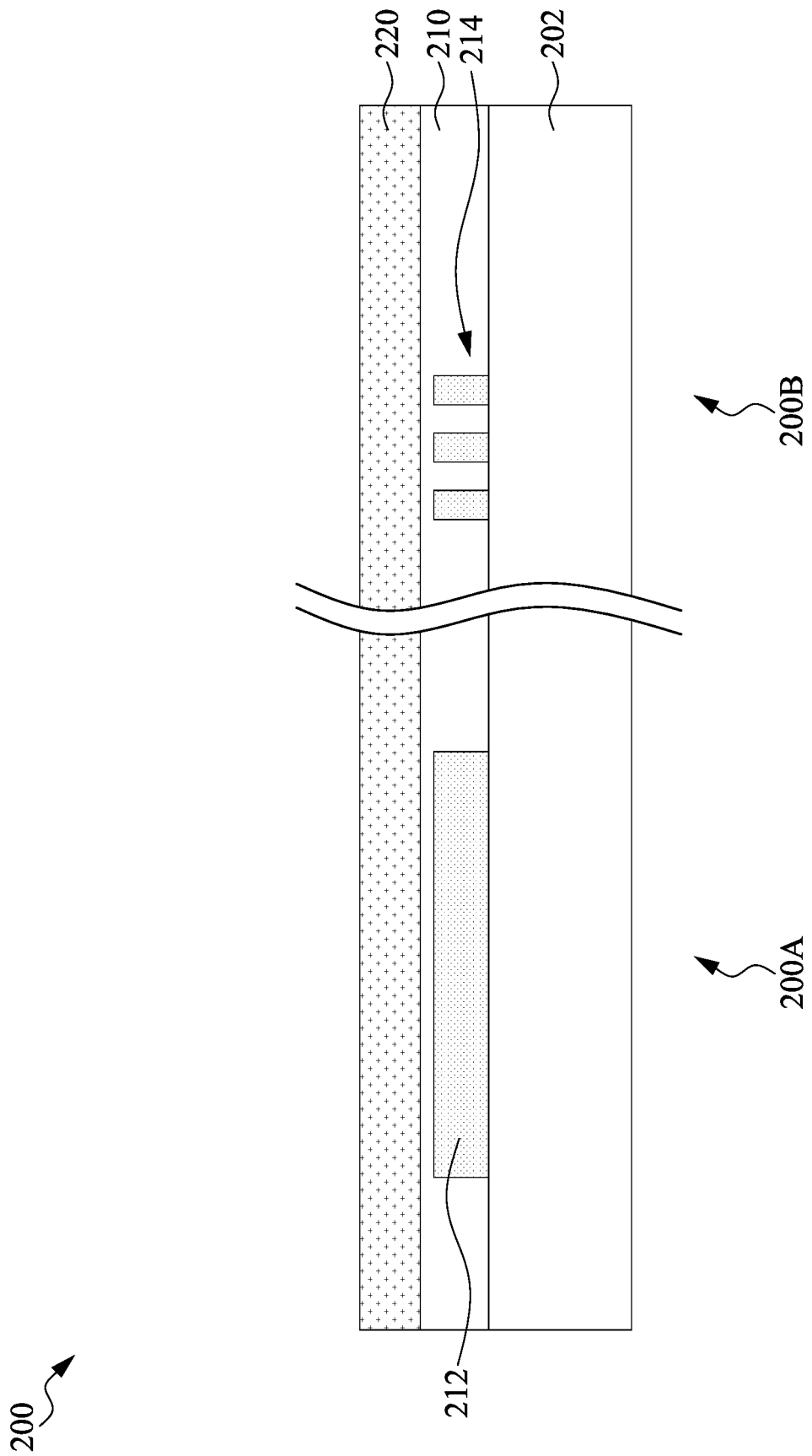
FIG. 2A, FIG. 2B, FIG. 2C, FIG. 2D, FIG. 2E, FIG. 2F, and FIG. 2G illustrate various stages of manufacturing a semiconductor device, in accordance with some embodiments of the present disclosure.

Referring to FIG. 2A, a semiconductor device structure 200 can be provided. The semiconductor device structure 200 can include a region 200A and a region 200B. In some embodiments, the region 200A can be utilized to define an area on which electronic component(s) is formed. In some embodiments, the region 200B can be utilized to define an area on which overlay mark(s) is formed.

In some embodiments, the electronic components can include active components and/or passive components. The active component may include a memory die (e.g., dynamic random access memory (DRAM) die, a static random access memory (SRAM) die, etc.)), a power management die (e.g., power management integrated circuit (PMIC) die)), a logic die (e.g., system-on-a-chip (SoC), central processing unit (CPU), graphics processing unit (GPU), application processor (AP), microcontroller, etc.)), a radio frequency (RF) die, a sensor die, a micro-electro-mechanical-system (MEMS) die, a signal processing die (e.g. digital signal processing (DSP) die)), a front-end die (e.g., analog front-end (AFE) dies)) or other active components. The passive component may include a capacitor, a resistor, an inductor, a fuse or other passive components.

The semiconductor device structure 200 can include a substrate 202. The substrate 202 may be a semiconductor substrate, such as a bulk semiconductor, a semiconductor-on-insulator (SOI) substrate, or the like. The substrate 202 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 202 may have a multilayer structure, or the substrate 202 may include a multilayer compound semiconductor structure.

A feature 212 can be formed on the region 200A of the semiconductor device structure 200. A pattern 214 can be formed on the region 200B of the semiconductor device structure 200. The feature 212 and the pattern 214 can be covered by an intermediate structure 210.

In some embodiments, the feature 212 can include an isolation structure, such as, a shallow trench isolation (STI), a field oxide (FOX), a local-oxidation of silicon (LOCOS) feature, and/or other suitable isolation elements. The isolation structure can include a dielectric material such as silicon oxide, silicon nitride, silicon oxy-nitride, fluoride-doped silicate (FSG), a low-k dielectric material, combinations thereof, and/or other suitable materials.

In some embodiments, the feature 212 can include a gate structure. The gate structure can include a gate dielectric layer and a gate electrode layer.

In some embodiments, the gate dielectric layer can include silicon oxide ($SiO_x$), silicon nitride ($Si_xN_y$), silicon oxynitride (SiON), or a combination thereof. In some embodiments, the gate dielectric layer can include dielectric material(s), such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

In some embodiments, the gate electrode layer can include a polysilicon layer. In some embodiments, the gate electrode layer can be made of a conductive material, such as aluminum (Al), copper (Cu), tungsten (W), titanium (Ti), tantalum (Ta), or other applicable materials. In some embodiments, the gate electrode layer can include a work function layer. The work function layer is made of a metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure. The gate electrode layer can be formed by low-pressure chemical vapor deposition (LPCVD) and plasma-enhanced CVD (PECVD).

In some embodiments, the feature 212 can include a conductive via, which can be disposed on a conductive trace, such as the zero metal layer (M0 layer) or the first metal layer (M1 layer). In this embodiment, the feature 212 can include a barrier layer and a conductive layer surrounded by the barrier layer. The barrier layer can include metal nitride or other suitable materials. The conductive layer can include metals, such as W, Ta, Ti, Ni, Co, Hf, Ru, Zr, Zn, Fe, Sn, Al, Cu, Ag, Mo, Cr, alloy or other suitable materials.

The pattern 214 can be formed on the region 200B of the semiconductor device structure 200. The pattern 214 can serve as a pattern of a pre-layer of an overlay mark. The material of the pattern 214 can be the same as that of the feature 212. The pattern 214 can be located at a horizontal level the same as that of the feature 212. The pattern 214 can be formed by suitable deposition processes and etching process. The deposition process can include, for example, chemical vapor deposition (CVD), atomic layer deposition (ALD), physical vapor deposition (PVD), low-pressure chemical vapor deposition (LPCVD), and sputtering. The etching process can include, for example, a wet etching or a dry etching.

The intermediate structure 210 can be disposed on or over the substrate 202. The intermediate structure 210 can include one or more intermediate layers made of insulating material, such as silicon oxide or silicon nitride. In some embodiments, the intermediate structure 210 can include conductive layers, such as metal layers or alloy layers. In some embodiments, the one or more intermediate layers can be formed by a suitable film forming method, such as chemical vapor deposition (CVD), atomic layer deposition (ALD) or physical vapor deposition (PVD). After the intermediate layers are formed, a thermal operation, such as rapid thermal annealing, can be performed. In other embodiments, a planarization operation, such as a chemical mechanical polishing (CMP) operation, is performed. In other embodiments, a removal operation, such as an etching process, can be performed. The etching process can include, for example, a dry etching process or a wet etching process. It is understood that additional operations can be provided before, during, and after processes as set forth above, and some of the operations described above can be replaced or eliminated, for additional embodiments of the method. The order of the operations/processes may be interchangeable.

The target layer 220 can be formed on the intermediate structure 210. In some embodiments, the target layer 220 can includes a conductive material or a semiconductor material, such as metal or metal alloy. In some embodiments, the metal includes titanium (Ti), aluminum (Al), tungsten (W), tantalum (Ta), copper (Cu), cobalt (Co), ruthenium (Ru), other suitable metal, or combinations thereof. In some embodiments, the metal alloy includes metal nitride, metal sulfide, metal selenide, metal oxide, metal silicide, other suitable metal alloy, or combinations thereof. In such embodiments, the metal alloy can be represented by a formula $MX_a$, where M is a metal and X is selected from the group consisting of nitrogen (N), sulfur (S), selenide (Se), oxygen (O), and silicon (Si). In some embodiments, a is about 0.4 to about 2.5. For example, In some embodiments, the to get layer 220 can include titanium nitride (TiN), tungsten nitride ($WN_2$), or tantalum nitride (TaN). In some embodiments, the target layer 220 can include a dielectric material, such as silicon oxide ($SiO_2$), silicon nitride (SiN), metal oxide, or metal nitride. In such embodiments, a material of the target layer 220 can be represented by a formula MXb, where M is a metal (for example, Al, hafnium (Hi), or lanthanum (La)) or Si and X is N, O, and/or carbon (C). In some embodiments, h is about 0.4 to about 2.5, For example, in some embodiments, the target layer 220 can include $SiO_2$, SiN, silicon oxynitride (SiON), silicon carbon nitride (SiCN), silicon carbide (SiC), aluminum oxide ($Al_2O_3$), (hafnium oxide ($HfO_2$), or lanthanum oxide ($La_2O_3$). In some embodiments, the dielectric material has a dielectric constant (k) of about 1 to about 40, such that the dielectric material can be a low-k dielectric material or a high-k dielectric material depending on semiconductor fabrication requirements. In some embodiments, the target layer 220 can include a hard mask layer to be patterned for use in subsequent process. In some embodiments, the target layer 220 can include a layer to be used for forming a gate structure (for example, a gate dielectric and/or a gate electrode), a source/drain feature, and/or a contact feature (for example, a conductive or dielectric feature of a multilayer interconnect (MLI)).

Figure 2B:
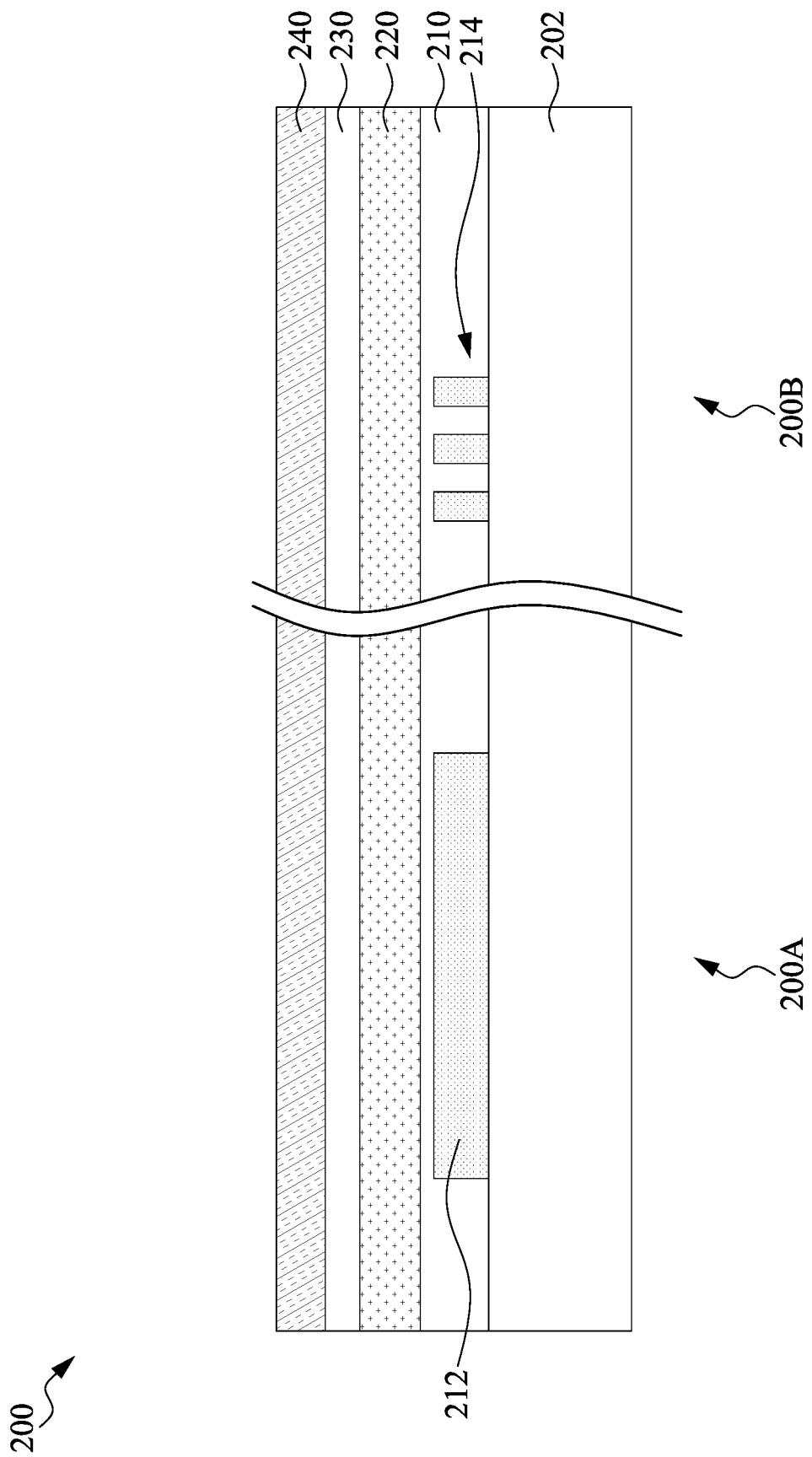

Referring to FIG. 2B, a material layer 230 can be formed on the target layer 220. A photoresist layer 240 can be formed on the material layer 230. In some embodiments, the material layer 230 can include an anti-reflective coating (ARC) layer. The material layer 230 can include a nitrogen-free ARC (NFARC) layer that includes a material such as $SiO_2$, silicon oxygen carbide (SOC), plasma enhanced chemical vapor deposited silicon oxide (PECVD-$SiO_2$), other suitable material, or combinations thereof.

In some embodiments, the photoresist layer 240 can be a negative-tone photoresist. In some embodiments, the photoresist layer 240 can include an acid generating component (such as a photoacid generator (PAG), a thermal acid generator (TAG) component, an acid labile group (ALG) component, a quencher component, a photon decomposable base (PDB) component, a chromophore component, a cross-linker component, a surfactant component, and/or other suitable components. When the photoresist layer 240 is exposed to radiation, the photoresist layer 240 can generate acids, which functions as a catalyst for causing chemical reactions that decrease (or increase) solubility of exposed portions of a photoresist layer. In this embodiment, acid generated from the PAG component catalyzes cross-linking of polymer, changing characteristics (for example, polarity and/or solubility) of exposed portions of the photoresist layer 240. For example, when the photoresist layer 240 is exposed with radiation reaching a defined exposure dose threshold, the solubility of exposed portions of the photoresist layer 240 can be decreased in a developer. In some implementations, the photoresist layer 240 can include poly (hydroxystyrene) (PHS), methacrylate, or a PHS methacrylate hybrid.

Figure 2C:
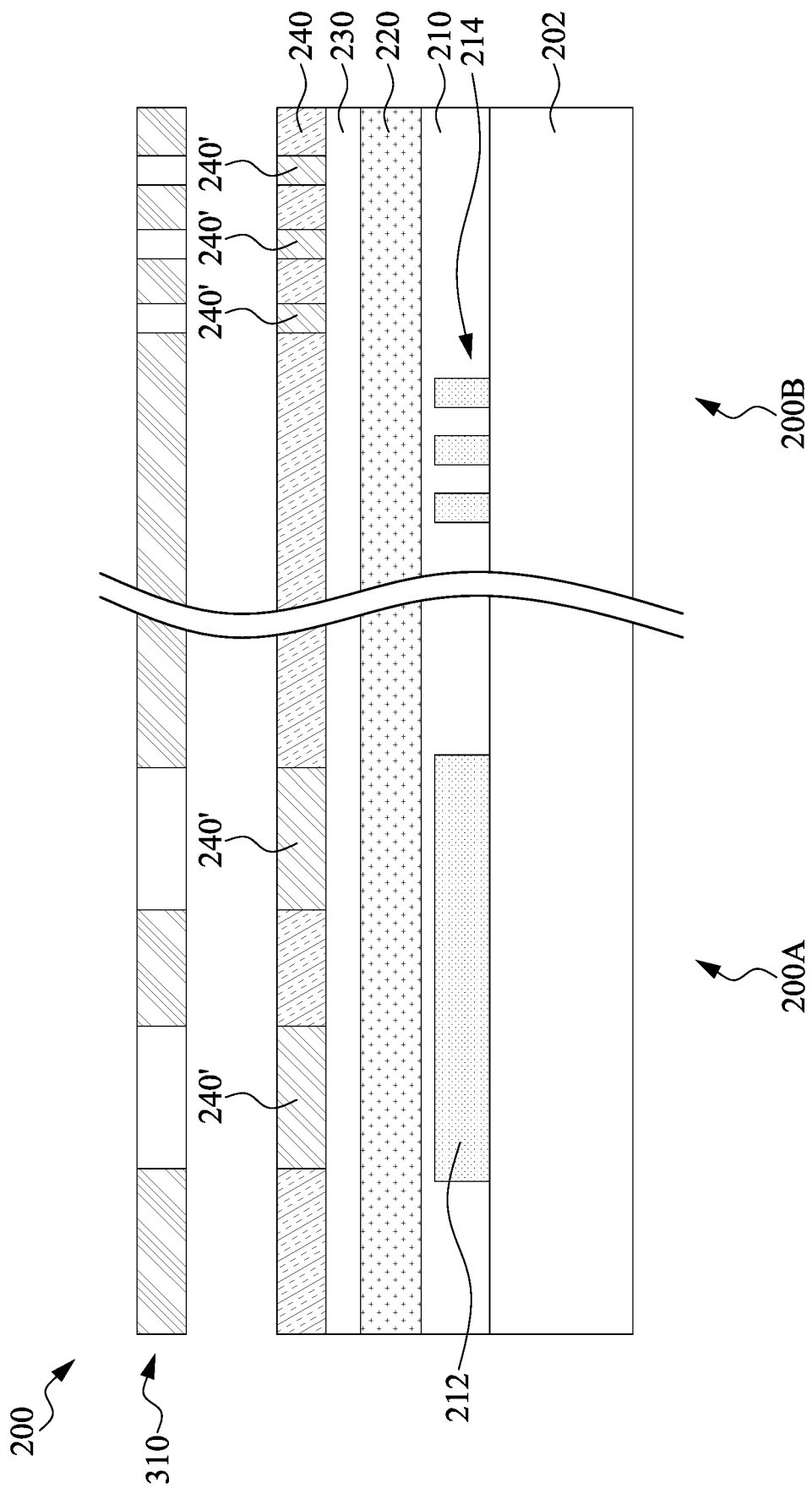

Referring to FIG. 2C, an exposure process is performed on the photoresist layer 240. In some embodiments, a mask 310 is utilized to define exposed areas of the photoresist layer 240 to form a patterned photoresist layer 240'. In some embodiments, the photoresist layer 240 is exposed to patterned radiation having a wavelength less than about 250 nm, such as 193 nm radiation from an ArF laser or other radiations. The exposure process can be in air, liquid (immersion lithography), or vacuum (for example, e-beam lithography).

Figure 2D:
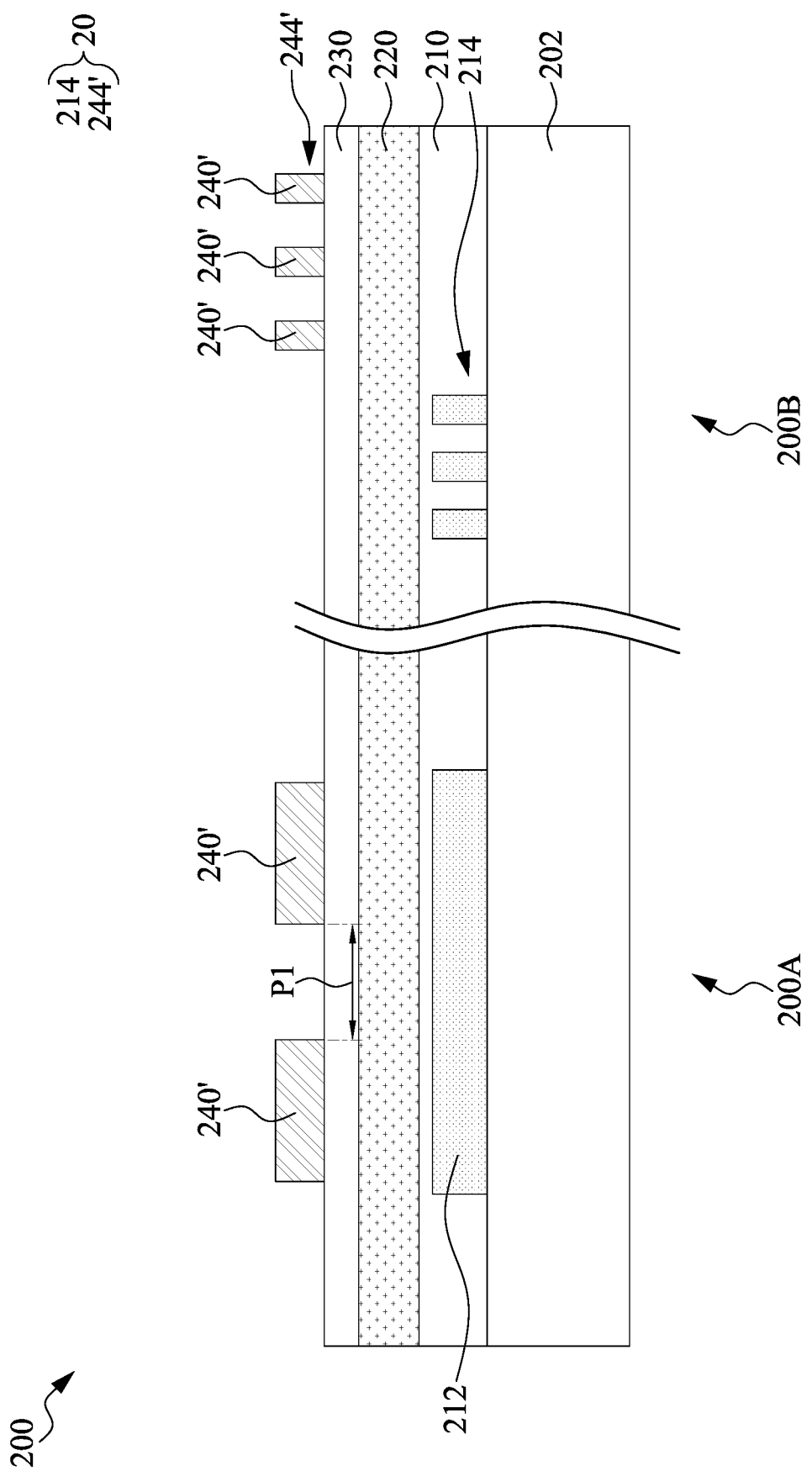

Referring to FIG. 2D, a developing process is performed. As a result, the portions of the photoresist layer 240 unexposed to radiation dissolves in a developer, while the patterned photoresist layer 240' remains on the material layer 230. The patterned photoresist layer 240' in the region 200A can serve as a portion of the mask pattern, which can be utilized to define the pattern of the target layer 220. In some embodiments, the patterned photoresist layer 240' can have a pitch P1. The patterned photoresist layer 240' in the region 200B can serve as a pattern 244' of a current layer of an overlay mark 20.

The developer can include, ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monoethyl ether, triethylene glycol monoethyl ether and methoxymethyl butanol. Suitable amide solvents include, for example, N-methyl-2-pyrrolidone, N,N-dimethylacetamide and N,N- dimethylformamide. Suitable hydrocarbon solvents include, for example; aromatic hydrocarbon solvents such as toluene, anisole and xylene. In addition, mixtures of these solvents, or one or more of the listed solvents mixed with a solvent other than those described above or mixed with water can be used.

In some embodiments, a rinsing process is performed after the developing process, for example, to remove any residue and/or particles from the semiconductor device structure 200. In some embodiments, a post-development baking (PDB) process is performed, for example, to ensure structural stability of the patterned photoresist layer 240'.

Figure 2E:
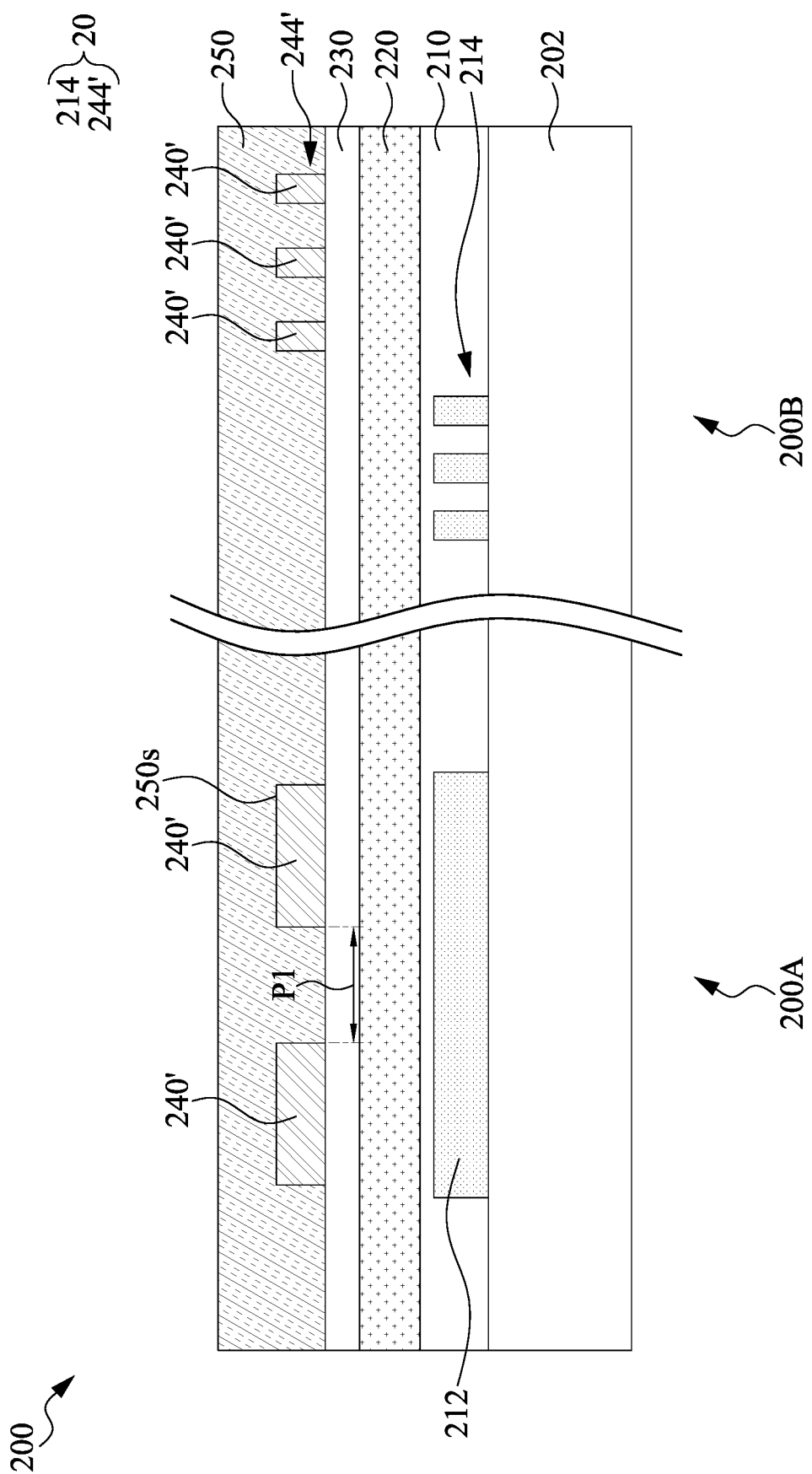

Referring to FIG. 2E, a pitch adjustment material 250 is formed on the material layer 230 to cover the patterned photoresist layer 240' and the pattern 244'. The pitch adjustment material 250 can include monomer(s) dissolved in an organic solvent, and can include one or more additional, optional components. In some embodiments, the pitch adjustment material 250 can include an acid-reactive material, such as an acid-catalyzed cross-linkable material. The pitch adjustment material 250 is typically then soft baked to remove solvent from the pitch adjustment material 250 and cause pitch adjustment material 250 to react with the patterned photoresist layer 240'.

Figure 2F:
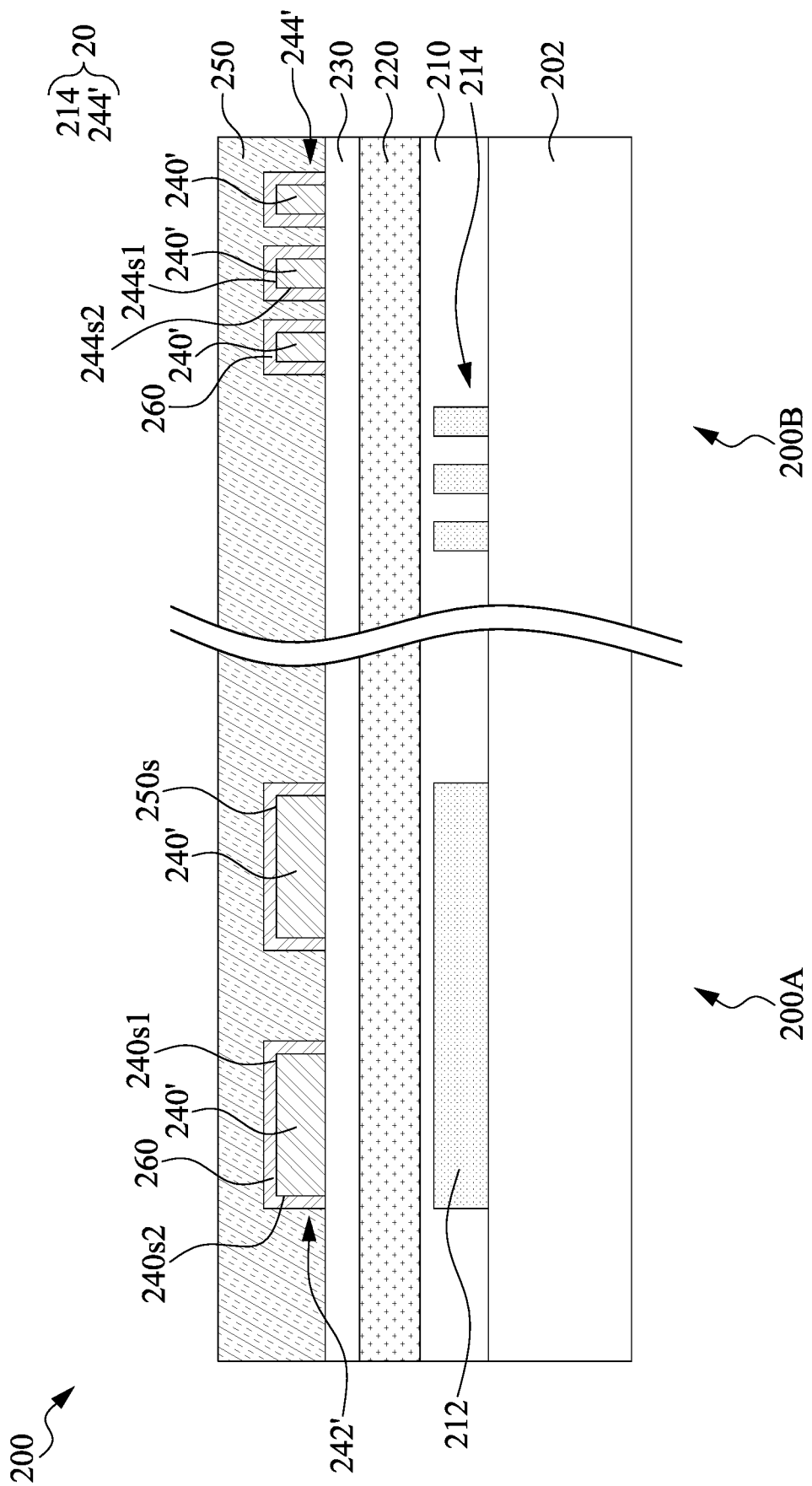

Referring to FIG. 2F, a pitch adjustment layer 260 is formed at an interface 250$s$ between the patterned photoresist layer 240' and the pitch adjustment material 250, thereby forming a mask pattern 242'. In some embodiments, the pitch adjustment layer 260 can cover or be in contact with a surface 240$s1$ (or an upper surface) of the patterned photoresist layer 240'. In some embodiments, the pitch adjustment layer 260 can cover or be in contact with a surface 240$s2$ (or a lateral surface) of the patterned photoresist layer 240'. In some embodiments, the pitch adjustment layer 260 can cover or be in contact with a surface 244$s1$ (or an upper surface) of the pattern 244'. In some embodiments, the pitch adjustment layer 260 can cover or be in contact with a surface 244$s2$ (or a lateral surface) of the pattern 244'. In some embodiments, the thickness of the pitch adjustment layer 260 can be controlled by determination of a time interval between the formation of the patterned photoresist layer 240' and formation of the pitch adjustment material 250.

Figure 2G:
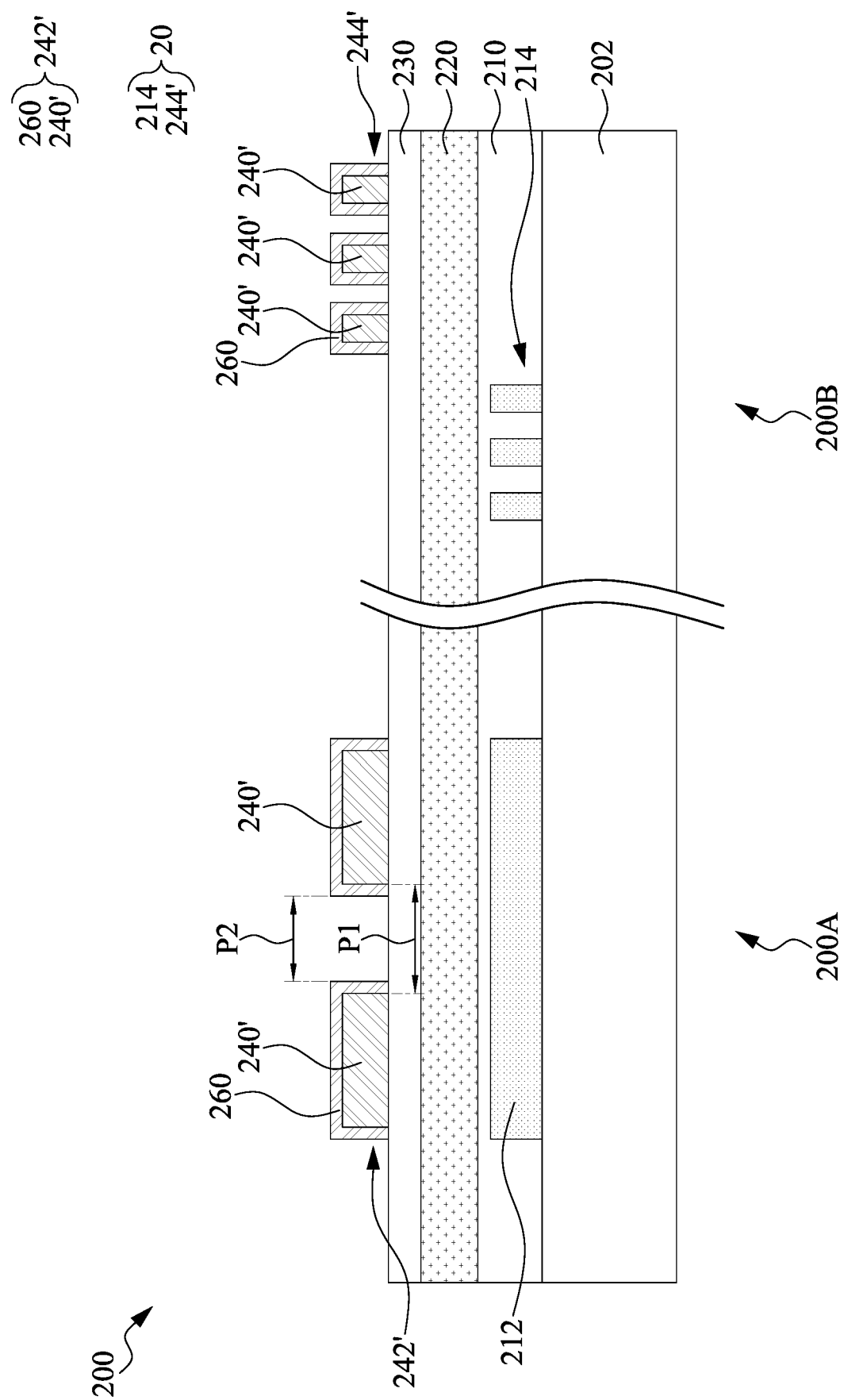

Referring to FIG. 2G, pitch adjustment material 250 not reacting with the patterned photoresist layer 240' can be removed. In some embodiments, the mask pattern 242', including the patterned photoresist layer 240' and the pitch adjustment layer 260, can have a pitch P2 smaller than the pitch P1. In subsequent processes, the pitch adjustment layer 260 can assist in reducing the spacing between adjacent lines of the target layer 220. In some embodiments, the pattern 244' can include the patterned photoresist layer 240' and the pitch adjustment layer 260'. In some embodiments, the thickness of the pitch adjustment layer 260 can be controlled so that the pitch P2 can be tuned based on the requirements of semiconductor fabrication processes.

Figure 3:
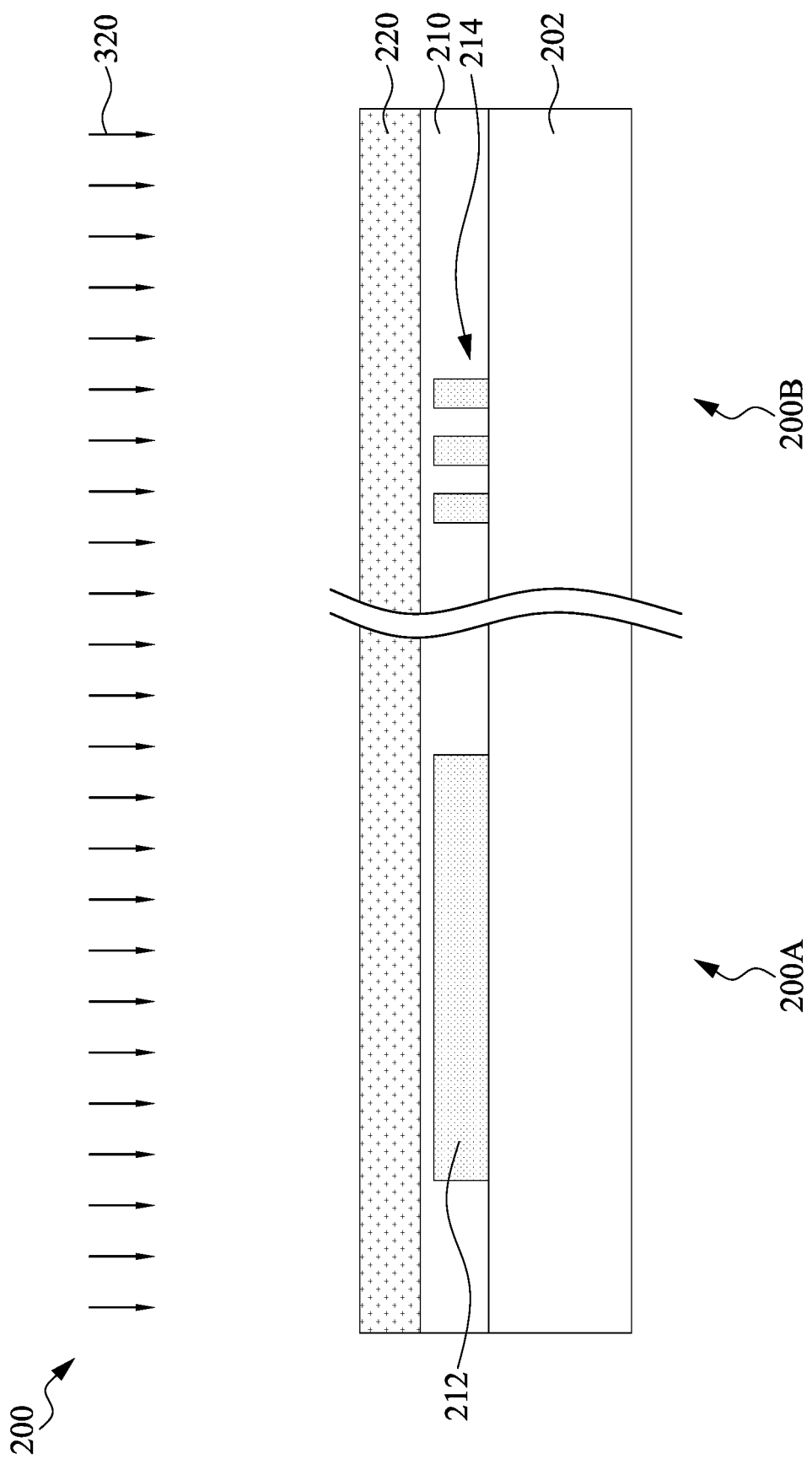
FIG. 3 illustrate one of various stages of manufacturing a semiconductor device, in accordance with some embodiments of the present disclosure.

Referring to FIG. 3, rework operation 320 can be performed. When the pitch P2 of the mask pattern 242' or the overlay error of the overlay mark 20 fails to meet the specification of the semiconductor fabrication processes, rework operation 320 can be performed to remove the mask pattern 242' and the pattern 244'. In some embodiments, rework operation 320 can include an etching process that can remove carbon-containing material. In some embodiments, oxygen plasma ashing process can be performed to remove the patterned photoresist layer 240' and the pitch adjustment layer 260. In some embodiments, the material layer 230 can be removed by rework operation 320.

Figure 4A:
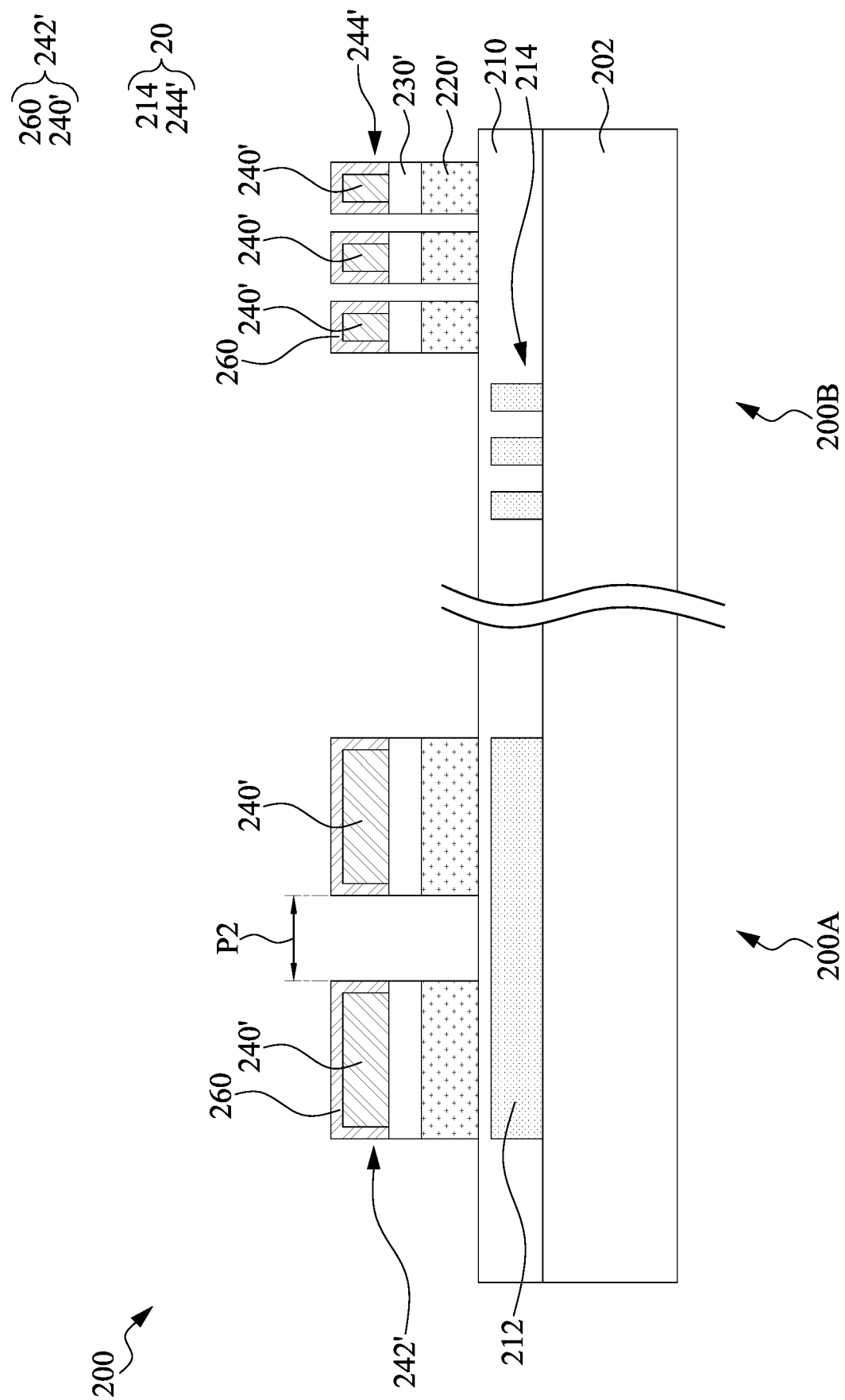
FIG. 4A, and FIG. 4B illustrate various stages of manufacturing a semiconductor device, in accordance with some embodiments of the present disclosure.

Referring to FIG. 4A, when the pitch P2 of the mask pattern 242', the overlay error of the overlay mark 20, or both meets the specification of the semiconductor fabrication process, the target layer 220 can be patterned to form a feature 220'. The pattern of the feature 220' can be defined by the mask pattern 242'.

Figure 4B:
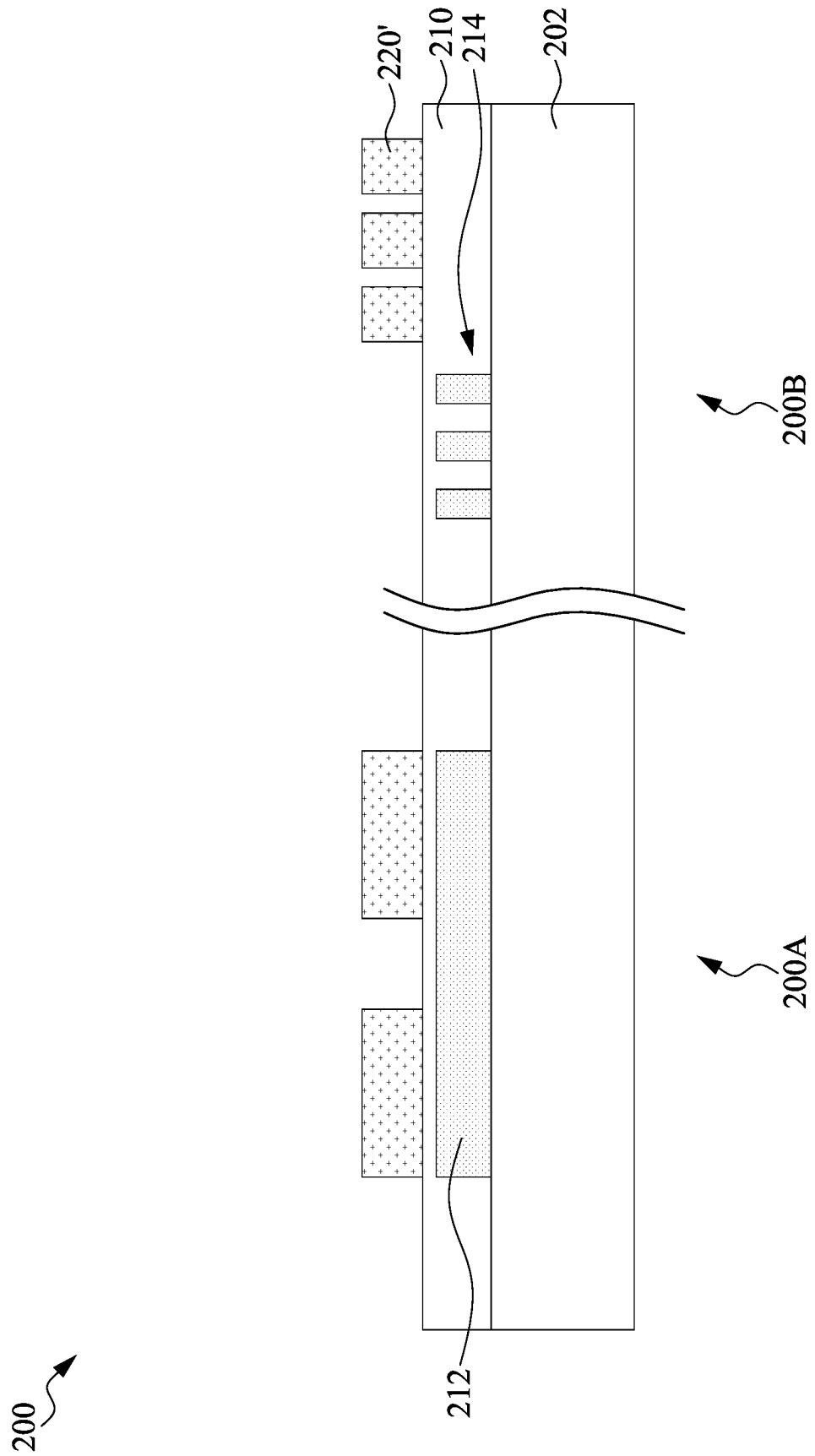

Referring to FIG. 4B, the mask pattern 242' and the pattern 244' can be removed. Since the pitch adjustment layer 260 can reduce the pitch of the mask pattern 242', the feature 220' can have a relatively small pitch.

Figure 5:
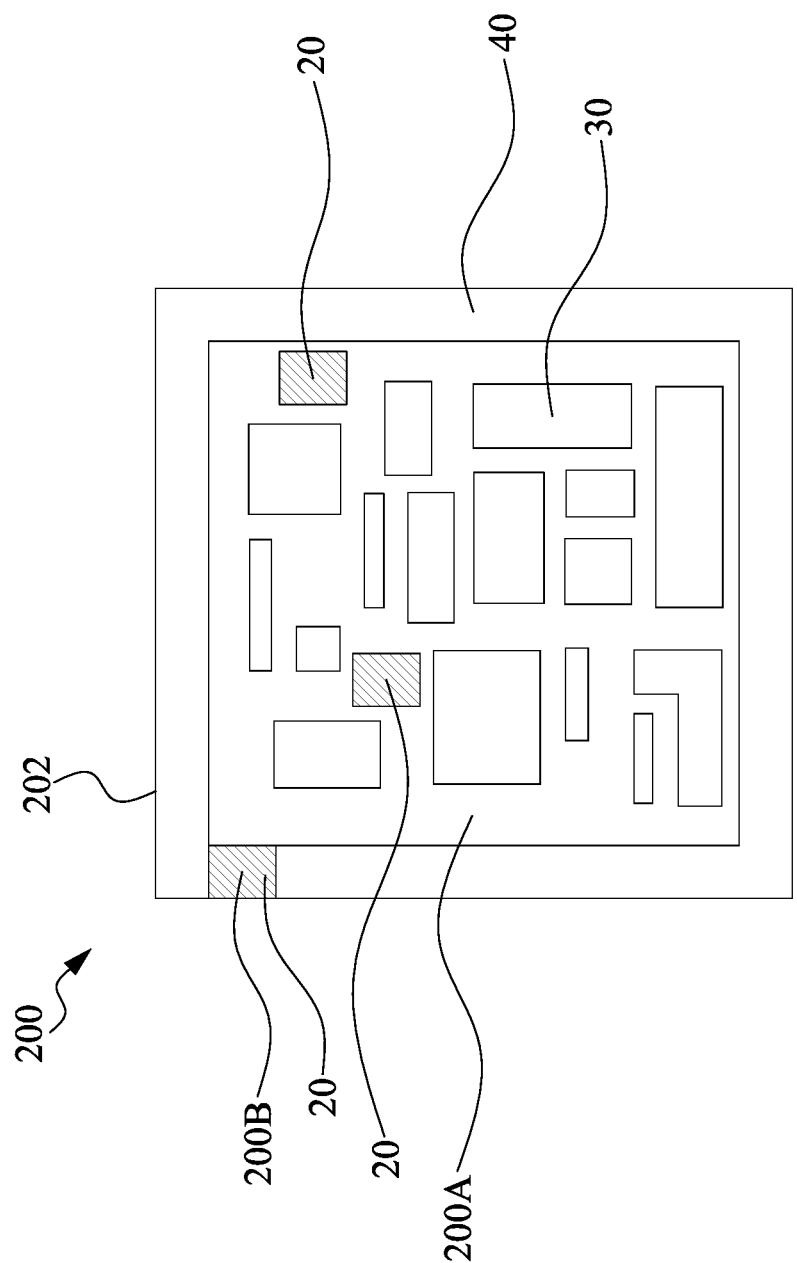
FIG. 5 is a top view of a semiconductor device structure, in accordance with some embodiments of the present disclosure.

FIG. 5 is a top view of a semiconductor device structure 200, in accordance with some embodiments of the present disclosure.

In some embodiments, the overlay mark 20 can be located on scribe lines 40 of the semiconductor device structure 200. In some embodiments, the overlay mark 20 can be located within the region 200A, on which multiple electronic components 30 are formed on. In this embodiment, the region 200B can be surrounded by the region 200A.

Figure 6:
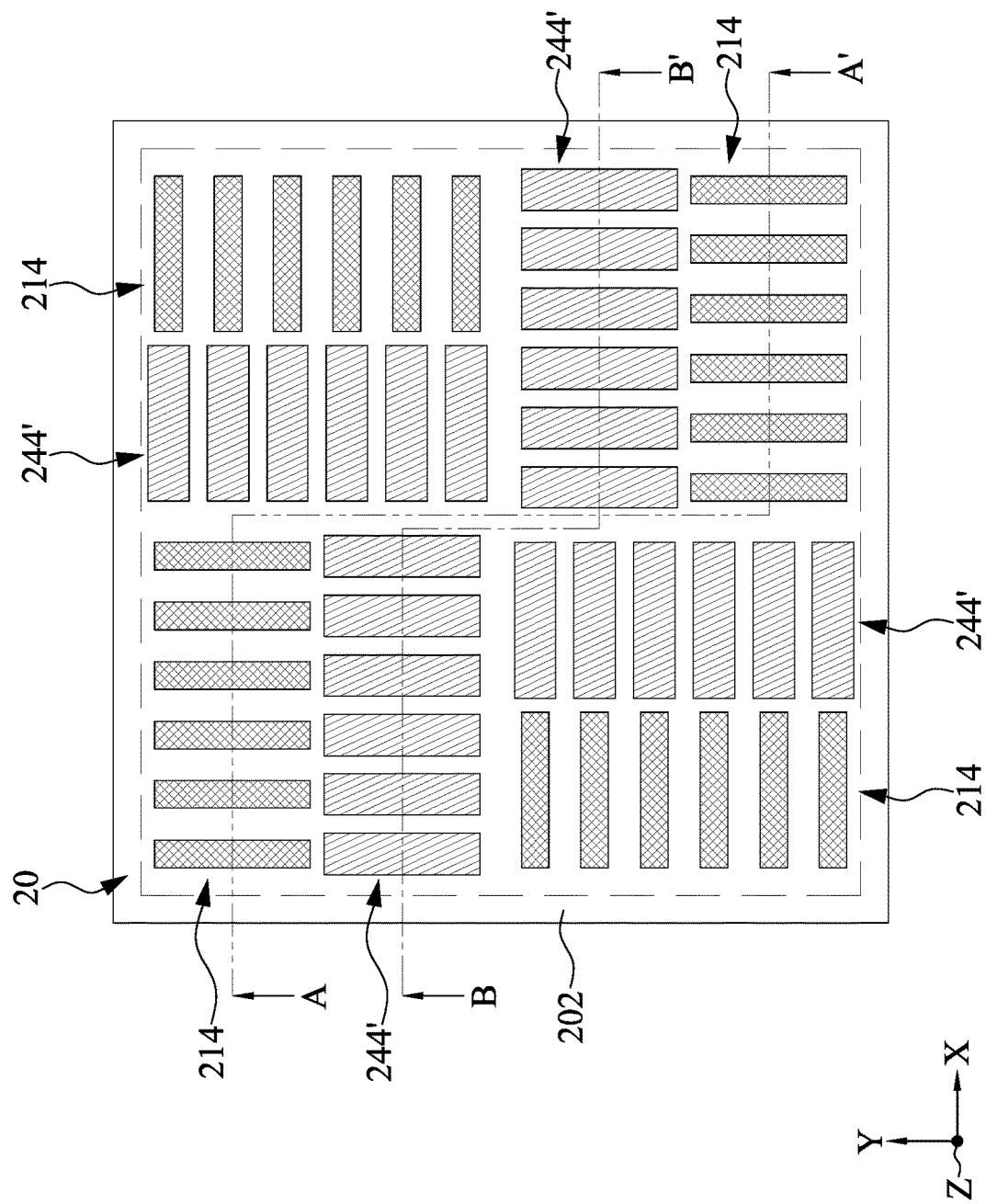
FIG. 6 is a top view of an overlay mark, in accordance with some embodiments of the present disclosure.

FIG. 6 is a top view of an overlay mark 20, in accordance with some embodiments of the present disclosure.

The overlay mark 20 can include patterns 214 and patterns 244' over the substrate 202, The pattern 214 can be a pre-layer's pattern. The pattern 244' can be a current layer's pattern. The pre-layer (or a lower-layer) can be located at a horizontal level different from that of the current layer (or an upper-layer). Each of the patterns 214 (or patterns 244') can be located in one of four quadrature targets areas, two of which are utilized to measure the overlay error of the X direction, and two of which are utilized to measure the overlay error of the Y direction.

While measuring an overlay error using an overlay mark, such as the overlay mark 20, an X-directional deviation is measured along a straight line in an X direction of the overlay mark 20. A Y-directional deviation is further measured along a straight line in a Y direction of the overlay mark 20. One single overlay mark, including the patterns 214 and the patterns 244' can be used to measure one X- and one Y-directional deviation between two layers on a substrate. Therefore, whether the current layer and the pre-layer are precisely aligned can be determined according to the X- and Y-directional deviations. The overlay error may include the X-directional deviation ($\Delta X$), the Y-directional deviation ($\Delta Y$), or the combination of both.

Figure 7:
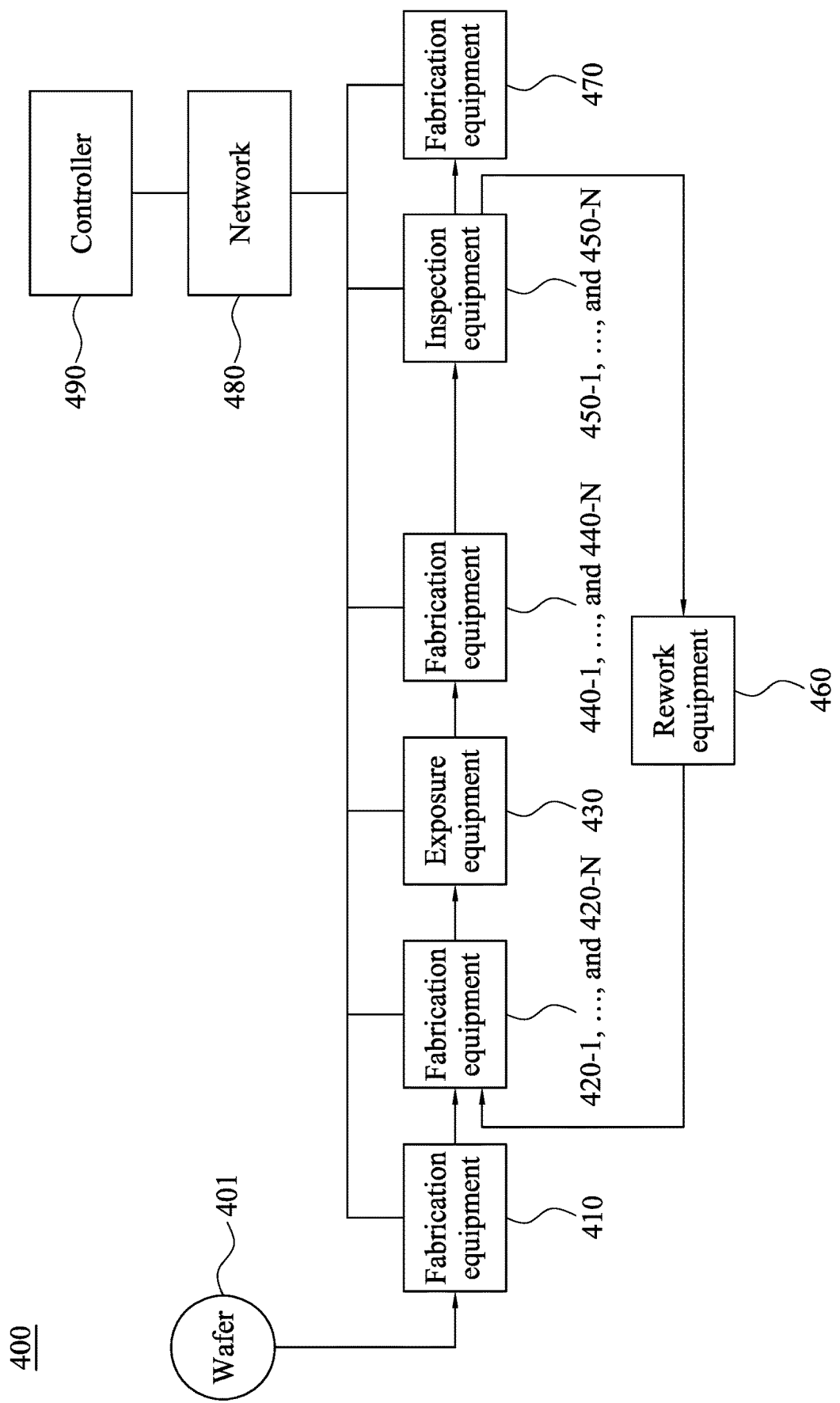
FIG. 7 is a block diagram illustrating a semiconductor fabrication system, in accordance with some embodiments of the present disclosure.

FIG. 7 is a block diagram illustrating a semiconductor fabrication system 400, in accordance with some embodiments of the present disclosure.

The semiconductor fabrication system 400 can include a plurality of fabrication equipment 410, 420-1, . . . , and 420-N, exposure equipment 430, fabrication equipment 440-1, . . . , and 440-N, inspection equipment 450-1, . . . , and 450-N, rework equipment 460 as well as fabrication equipment 470.

The fabrication equipment 410, 420-1, . . . , and 420-N, exposure equipment 430, fabrication equipment 440-1, . . . , and 440-N, inspection equipment 450-1, . . . , and 450-N, rework equipment 460 as well as fabrication equipment 470 can be signally coupled with a controller 490 through a network 480.

The fabrication equipment 410 can be utilized to form the pattern in a pre-layer, such as the feature 212 and the pattern 214 shown in FIG. 2A. In some embodiments, the fabrication equipment 410 may be utilized to form an isolation structure, a gate structure, a conductive via or other layers.

The fabrication equipment 420-1, ..., and 420-N can be utilized to form an intermediate structure (e.g., the intermediate structure 210), material layer (e.g., the material layer 230), and photoresist (e.g., the photoresist layer 240) shown in FIG. 2B. Each piece of the fabrication equipment 420-1, ..., and 420-N can be utilized to perform a deposition process, an etching process, a chemical mechanical polishing process, photoresist coating process, an alignment process, or other processes.

The exposure equipment 430 can be utilized to define the exposed region of the photoresist layer (e.g., the photoresist layer 240') in a current layer, as shown in FIG. 2C.

A part of the fabrication equipment 440-1, ..., and 440-N can be utilized to develop the photoresist layer, thereby forming a patterned photoresist layer (e.g., the patterned photoresist layer 240' in region 200A) and a pattern (e.g., the patterned photoresist layer 240' in region 200B) in a current layer, as shown in FIG. 2D. A part of the fabrication equipment 440-1, ..., and 440-N can be utilized to form a pitch adjustment material (e.g., the pitch adjustment material 250), thereby forming a pitch adjustment layer (e.g., the pitch adjustment layer 260) on the patterned photoresist layer and on the pattern of the current layer, as shown in FIG. 2E, FIG. 2F, and FIG. 2G. Each piece of the fabrication equipment 440-1, ..., and 440-N can be utilized to perform a developing process, a coating process, a rinsing process, a baking process or other processes. In some embodiments, after the exposure process is performed on the wafer 401 by exposure equipment 430, a predetermined queue time can be determined. The controller 490 can send a signal to allow the wafer 401 to enter the fabrication equipment 440-1, ..., and 440-N at a desired time.

A part of the inspection equipment 450-1, ..., and 450-N can be utilized to obtain optical images of the patterns of the pre-layer and the current layer, and to generate an overlay error of an overlay mark (e.g., the overlay mark 20) based on the aforesaid optical images of the patterns of the pre-layer and the current layer. A part of the inspection equipment 450-1, ..., and 450-N can be utilized to measure a pitch of a mask pattern (e.g., the mask pattern 242').

The rework equipment 460 can be utilized to perform a rework operation (e.g, the rework operation 320) to remove the patterned photoresist layer, the pitch adjustment layer or both, as shown in FIG. 3. In some embodiments, the rework equipment 460 can be utilized to perform an etching process, such as an oxygen plasma ashing process.

The fabrication equipment 470 can be utilized to define a pattern of a target layer (e.g., the target layer 220) by the mask pattern, as shown in FIG. 4A and FIG. 4B. The fabrication equipment 470 can be utilized to perform an etching process or other processes.

The network 480 can be the internet or an intranet implementing network protocols such as transmission control protocol (TCP). Through the network 480, each piece of the fabrication equipment 410, 420-1, ..., and 420-N, exposure equipment 430, fabrication equipment 440-1, ..., and 440-N, inspection equipment 450-1, ..., and 450-N, rework equipment 460 as well as fabrication equipment 470 may download or upload work in progress (WIP) information regarding to the wafer or the fabrication equipment from or to the controller 490.

The controller 490 can include a processer, such as a central processing unit (CPU) to generate corrected overlay error based on the inspection equipment 450-1, ..., and 450-N.

Although FIG. 7 does not show any other fabrication equipment before the fabrication equipment 410, the exemplary embodiment is not intended to be limiting. In other exemplary embodiments, various kinds of fabrication equipment can be scheduled before the fabrication equipment 410, and can be used to perform various processes according to the design requirement.

In the exemplary embodiments, a wafer 401 is transferred to the fabrication equipment 410 to start a sequence of different processes. The wafer 401 may be processed by various stages forming at least one layer of material. The exemplary embodiments are not intended to limit the progress of the wafer 401. In other exemplary embodiments, the wafer 401 may include various layers, or any stages between the beginning and the completion of a product, before the wafer 401 is transferred to the fabrication equipment 410. In the exemplary embodiments, the wafer 401 can be processed by the fabrication equipment 410, 420-1, ..., and 420-N, exposure equipment 430, fabrication equipment 440-1, ..., and 440-N, inspection equipment 450-1, ..., and 450-N, as well as rework equipment 460 (or fabrication equipment 470) in a sequential order.

Figure 8:
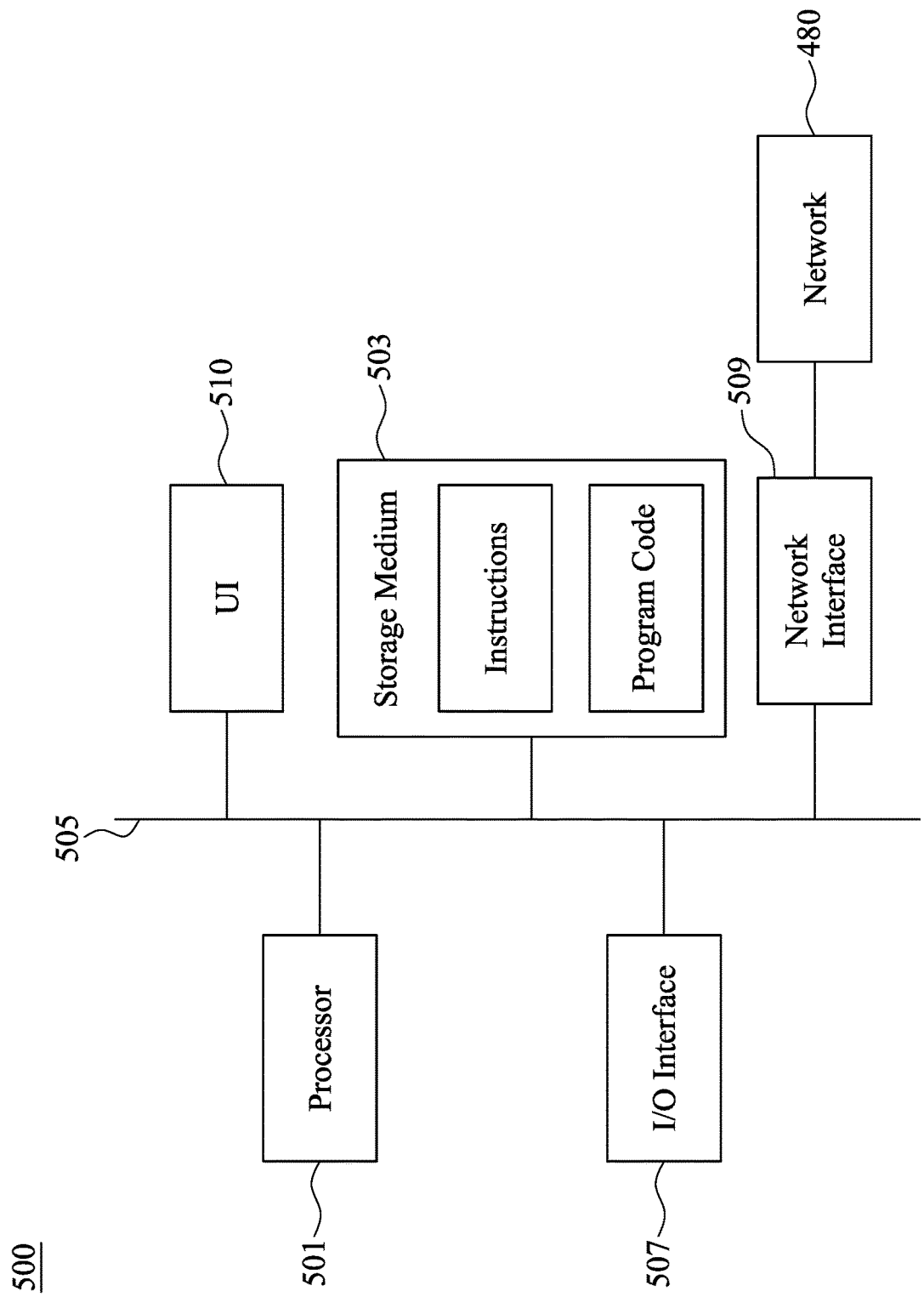
FIG. 8 is a diagram illustrating hardware of a semiconductor fabrication system, in accordance with various aspects of the present disclosure.

The processes illustrated in FIG. 1, FIG. 1A-FIG. 1D, FIG. 2A-FIG. 2G, and FIG. 7 may be implemented in the controller 490, or a computing system that organizes the fabrication of wafer by controlling every part or a portion of the fabrication equipment in the facility. FIG. 8 is a diagram illustrating hardware of a semiconductor fabrication system 500, in accordance with various aspects of the present disclosure. The system 500 includes one or more hardware processor 501 and a non-transitory computer readable storage medium 503 encoded with, i.e., storing, the program codes (i.e., a set of executable instructions.) The computer readable storage medium 503 may also be encoded with instructions for interfacing with fabrication equipment for producing the semiconductor device. The processor 501 is electrically coupled to the computer readable storage medium 503 via a bus 505. The processor 501 is also electrically coupled to an I/O interface 507 by the bus 505. A network interface 509 is also electrically connected to the processor 501 via the bus 505. The network interface is connected to a network, so that the processor 501 and the computer readable storage medium 503 are capable of connecting to external elements via network 480. The processor 501 is configured to execute the computer program code encoded in the computer readable storage medium 505 in order to cause the system 500 to be usable for performing a portion or all of the operations as described in the methods illustrated in FIG. 1, FIG. 1A-FIG. 1D, FIG. 2A-FIG. 2G, and FIG. 7.

In some exemplary embodiments, the processor 501 can be, but is not limited to, a central processing unit (CPU), a multi-processor, a distributed processing system, an application specific integrated circuit (ASIC), and/or a suitable processing unit. Various circuits or units are within the contemplated scope of the present disclosure.

In some exemplary embodiments, the computer readable storage medium 503 can be, but is not limited to, an electronic, magnetic, optical, electromagnetic, infrared, and/or a semiconductor system (or apparatus or device). For example, the computer readable storage medium 503 includes a semiconductor or solid-state memory, a magnetic tape, a removable computer diskette, a random access memory (RAM), a read-only memory (ROM), a rigid magnetic disk, and/or an optical disk. In one or more exemplary embodiments using optical disks, the computer readable storage medium 503 also includes a compact disk-read only memory (CD-ROM), a compact disk-read/write (CD-R/W), and/or a digital video disc (DVD).

In some exemplary embodiments, the storage medium 503 stores the computer program code configured to cause system 500 to perform methods illustrated in FIG. 1, FIG. 1A-FIG. 1D, FIG. 2A-FIG. 2G, and FIG. 7. In one or more exemplary embodiments, the storage medium 501 also stores information needed for performing the methods illustrated in FIG. 1, FIG. 1A-FIG. 1D, FIG. 2A-FIG. 2G and FIG. 7 as well as in formation generated during performing the methods and/or a set of executable instructions to perform the operation of methods illustrated in FIG. 1, FIG. 1A-FIG. 1D, FIG. 2A-FIG. 2G, and FIG. 7. In some exemplary embodiments, a user interface 510, e.g., a graphical user interface (GUI) may be provided for a user to operate on the system 500.

In some exemplary embodiments, the storage medium 503 stores instructions for interfacing with external machines. The instructions enable processor 501 to generate instructions readable by the external machines to effectively implement the methods illustrated in FIG. 1, FIG. 1A-FIG. 1D, FIG. 2A-FIG. 2G, and FIG. 7 during an analysis.

System 500 includes input and output (I/O) interface 507. The I/O interface 507 is coupled to external circuitry. In some exemplary embodiments, the I/O interface 507 can include, but is not limited to, a keyboard, keypad, mouse, trackball, track-pad, touch screen, and/or cursor direction keys for communicating information and commands to processor 501.

In some exemplary embodiments, the I/O interface 507 can include a display, such as a cathode ray tube (CRT), liquid crystal display (LCD), a speaker, and so on. For example, the display shows information.

System 500 can also include a network interface 509 coupled to the processor 501. The network interface 509 allows system 500 to communicate with network 480, to which one or more other computer systems are connected. For example, the system 500 may be connected to the fabrication equipment 410, 420-1, . . . , and 420-N, exposure equipment 430, fabrication equipment 440-1, . . . , and 440-N, inspection equipment 450-1, and 450-N, rework equipment 460 as well as fabrication equipment 470 through the network interface 509 connecting to the network 480.

One aspect of the present disclosure provides a method of manufacturing a semiconductor device structure The method includes: providing a substrate; forming a photoresist layer on the substrate; patterning the photoresist layer to form a patterned photoresist layer; forming a pitch adjustment layer on the patterned photoresist layer to define a mask pattern; and determining whether the mask pattern meets a specification of semiconductor fabrication processes; when it is determined that the mask does not meet the specification of semiconductor fabrication processes, performing a rework operation to remove the pitch adjustment layer.

Another aspect of the present disclosure provides another method of manufacturing a semiconductor device structure The method includes: providing a substrate including a target layer; forming a photoresist layer on the substrate; patterning the photoresist layer to form a patterned photoresist layer with a first pitch; forming a pitch adjustment layer on the patterned photoresist layer to define a mask pattern with a second pitch less than the first pitch; and patterning the target layer by with a pattern by the mask pattern.

Another aspect of the present disclosure provides another method of manufacturing a semiconductor device structure The method includes: providing a substrate; forming a photoresist layer on the substrate; exposing a first portion of the photoresist layer to radiation while a second portion of the photoresist layer is covered thereby unexposed to the radiation; applying a negative tone developer to the photoresist layer to remove the second portion of the photoresist layer to form the patterned photoresist layer; and forming a pitch adjustment material on the patterned photoresist layer, wherein the pitch adjustment material reacts with the patterned photoresist layer to form a pitch adjustment layer at an interface between the pitch adjustment material and the patterned photoresist layer.

The embodiments of the present disclosure disclose a method of manufacturing a semiconductor device structure. In some embodiments, a pitch adjustment layer is formed on a negative photoresist layer, assisting in defining a mask pattern with a relatively small pitch. Further, if the mask pattern fails to meet the specification of semiconductor manufacturing processes, a rework operation can be performed to remove the pitch adjustment layer and/or the patterned photoresist layer, which can improve the yield of manufacturing the semiconductor device structure.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

What is claimed is:

1. A method of manufacturing a semiconductor device structure, comprising:
   providing a substrate;
   forming a photoresist layer on the substrate;
   patterning the photoresist layer to form a patterned photoresist layer;
   forming a pitch adjustment layer on the patterned photoresist layer to define a mask pattern;
   determining whether the mask pattern meets a specification of semiconductor fabrication processes; and
   when it is determined that the mask does not meet the specification of semiconductor fabrication processes, performing a rework operation to remove the pitch adjustment layer;
   wherein determining whether the mask pattern meets the specification of semiconductor fabrication processes comprises:
   determining whether an overlay error of an overlay mark exceeds a predetermined first target.

2. The method of claim 1, wherein the rework operation further comprises:
   removing the patterned photoresist layer.

3. The method of claim 1, further comprising:
forming a lower-layer pattern; and
forming an upper-layer pattern to define the overlay mark, wherein the upper-layer pattern is located at a horizontal level the same as that of the mask pattern, and the overlay error is determined by a misalignment of the lower-layer pattern and the upper-layer pattern.

4. The method of claim 3, wherein the upper-layer pattern comprises the photoresist layer and the pitch adjustment layer.

5. The method of claim 1, wherein determining whether the mask pattern meets the specification of semiconductor fabrication processes comprises:
determining whether a pitch of the mask pattern is smaller than a predetermined second target.

6. The method of claim 1, wherein forming the pitch adjustment layer comprises:
forming a pitch adjustment material on the patterned photoresist layer and on the substrate, wherein the pitch adjustment material reacts with the patterned photoresist layer to form the pitch adjustment layer; and
removing the pitch adjustment material.

7. The method of claim 6, wherein the pitch adjustment material comprises an acid-reactive material.

8. The method of claim 1, further comprising:
removing the patterned photoresist layer before forming the pitch adjustment layer when a queue time, after the patterned photoresist layer is formed, exceeds a third predetermined target.

9. The method of claim 1, wherein patterning the photoresist layer comprises:
exposing a first portion of the photoresist layer to radiation while a second portion of the photoresist layer is covered thereby unexposed to the radiation; and
applying a negative tone developer to the photoresist layer to remove the second portion of the photoresist layer to form the patterned photoresist layer.

10. The method of claim 1, wherein the pitch adjustment layer covers an upper surface and a lateral surface of the patterned photoresist layer.

11. A method of manufacturing a semiconductor device structure, comprising:
providing a substrate including a target layer;
forming a photoresist layer on the substrate;
patterning the photoresist layer to form a patterned photoresist layer with a first pitch;
forming a pitch adjustment layer on the patterned photoresist layer to define a mask pattern with a second pitch less than the first pitch;
patterning the target layer with a pattern by the mask pattern; and
determining a predetermined queue time after the patterned photoresist layer is formed so as to determine the second pitch of the mask pattern.

12. The method of claim 11, wherein forming the pitch adjustment layer comprises:
forming a pitch adjustment material on the patterned photoresist layer, wherein the pitch adjustment material reacts with the patterned photoresist layer to form the pitch adjustment layer; and
removing the pitch adjustment material;
wherein the pitch adjustment material comprises an acid-reactive material.

13. The method of claim 11, further comprising:
removing the patterned photoresist layer before forming the pitch adjustment layer when a queue time, after the patterned photoresist layer is formed, exceeds a predetermined first target.

14. The method of claim 11, further comprising:
removing the pitch adjustment layer when the second pitch is less than a predetermined second target; and
removing the patterned photoresist layer when the second pitch is less than the predetermined second target.

15. The method of claim 11, further comprising:
forming an overlay mark on the substrate;
determining whether an overlay error of an overlay mark is smaller than a third predetermined target;
removing the patterned photoresist layer when the overlay error of the overlay mark exceeds the predetermined third target;
forming a lower-layer pattern; and
forming an upper-layer pattern to define the overlay mark, wherein the upper-layer pattern is located at a horizontal level the same as that of the mask pattern, wherein the upper-layer pattern comprises the photoresist layer and the pitch adjustment layer;
removing the upper-layer pattern when the overlay error of the overlay mark exceeds the predetermined third target.

16. A method of manufacturing a semiconductor device structure, comprising:
providing a substrate;
forming a photoresist layer on the substrate;
exposing a first portion of the photoresist layer to radiation while a second portion of the photoresist layer is covered thereby unexposed to the radiation;
applying a negative tone developer to the photoresist layer to remove the second portion of the photoresist layer to form the patterned photoresist layer;
forming a pitch adjustment material on the patterned photoresist layer, wherein the pitch adjustment material reacts with the patterned photoresist layer to form a pitch adjustment layer at an interface between the pitch adjustment material and the patterned photoresist layer;
removing the pitch adjustment material to define a mask pattern comprising the pitch adjustment layer and the pitch adjustment layer;
determining whether the mask pattern meets a specification of semiconductor fabrication processes; and
when it is determined that the mask does not meet the specification of semiconductor fabrication processes, performing a rework operation;
wherein determining whether the mask pattern meets the specification of semiconductor fabrication processes comprises:
determining whether an overlay error of an overlay mark exceeds a predetermined first target.

* * * * *